United States Patent
Lin et al.

(10) Patent No.: US 10,601,450 B2
(45) Date of Patent: Mar. 24, 2020

(54) LIST MANAGEMENT FOR PARALLEL OPERATIONS OF POLAR CODES

(71) Applicant: QUALCOMM Incorporated, San Diego, CA (US)

(72) Inventors: Jamie Menjay Lin, San Diego, CA (US); Yang Yang, San Diego, CA (US); Gabi Sarkis, San Diego, CA (US); Rotem Cooper, San Diego, CA (US); John Edward Smee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 59 days.

(21) Appl. No.: 15/937,503

(22) Filed: Mar. 27, 2018

(65) Prior Publication Data

US 2018/0287640 A1 Oct. 4, 2018

Related U.S. Application Data

(60) Provisional application No. 62/478,509, filed on Mar. 29, 2017.

(51) Int. Cl.
*H03M 13/00* (2006.01)
*H03M 13/37* (2006.01)
(Continued)

(52) U.S. Cl.
CPC ....... *H03M 13/3746* (2013.01); *H03M 13/13* (2013.01); *H03M 13/6502* (2013.01);
(Continued)

(58) Field of Classification Search
None
See application file for complete search history.

(56) References Cited

U.S. PATENT DOCUMENTS

2014/0019820 A1* 1/2014 Vardy ............... H03M 13/13
714/752
2014/0208183 A1* 7/2014 Mahdavifar ....... H03M 13/296
714/755
(Continued)

OTHER PUBLICATIONS

Coherent Logix Inc: "Early Block Discrimination with Polar Codes to Further Accelerate DCI Blind Detection", 3GPP Draft, R1-1701897 Early Block Discrimination with Polar Codes to Further Accelerate DCI Blind Detection, 3RD Generation Partnership Project (3GPP) (Year: 2017).*
(Continued)

*Primary Examiner* — Daniel F. McMahon
(74) *Attorney, Agent, or Firm* — Holland & Hart LLP

(57) ABSTRACT

Techniques are described to address run-time issues and other considerations of data structure reorganization operations executed while decoding a polar code. A receiving entity (e.g., a user equipment or a base station) partitions an array, or other data structure, into sections. The array is used during a list decoding operation of a polar code. As the array is populated with path elements for candidate paths, each section is organized and a permutation pattern is calculated for each section. Upon identifying a section reorganization event, the array or subsections of the array are reorganized according the permutation patterns determined for each section.

30 Claims, 14 Drawing Sheets

(51) Int. Cl.
  *H04L 1/00* (2006.01)
  *H03M 13/13* (2006.01)
(52) U.S. Cl.
  CPC .......... *H04L 1/0041* (2013.01); *H04L 1/0054* (2013.01); *H04L 1/0057* (2013.01)

(56) References Cited

U.S. PATENT DOCUMENTS

2017/0353193 A1* 12/2017 Jang .................... H03M 13/091
2018/0048418 A1*  2/2018 Ge ........................ H04L 1/0038
2018/0248564 A1*  8/2018 Kim .................. H03M 13/1575
2018/0323809 A1* 11/2018 Lin .......................... H04L 1/00
2018/0323810 A1* 11/2018 Sarkis .................. H03M 13/13

OTHER PUBLICATIONS

P. Giard et al., "Hardware decoders for polar codes: An overview," 2016 IEEE International Symposium on Circuits and Systems (ISCAS), Montreal, QC, 2016, pp. 149-152. (Year: 2016).*

* cited by examiner

LIST MANAGEMENT FOR PARALLEL OPERATIONS OF POLAR CODES

CROSS REFERENCE

The present Application for Patent claims the benefit of U.S. Provisional Patent Application No. 62/478,509 by LIN et al., entitled "LIST MANAGEMENT FOR PARALLEL OPERATIONS OF POLAR CODES," filed Mar. 29, 2017, which is assigned to the assignee hereof and expressly incorporated by reference herein for any and all purposes.

BACKGROUND

The following relates generally to wireless communication, and more specifically to list management for parallel operations of polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, LTE-Advanced (LTE-A), or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device and decoded by a receiving device using an appropriate algorithm. In some cases, the algorithm may be an example of an error correcting code. Error correcting codes may be used to introduce redundancy in a code block so that transmission errors may be detected and corrected. Some examples of algorithms with error correcting codes include convolutional codes, low-density parity-check (LDPC) codes, and polar codes. Polar coding may use reliability metrics during encoding and decoding such that information bits may be loaded on channel instances that are associated with favorable (e.g., high) reliability metrics. Such techniques, however, may be associated with computational complexity and increased latency, which may impact system performance. Improved techniques for efficiently encoding and decoding may be desired.

SUMMARY

The described techniques relate to improved methods, systems, devices, or apparatuses that support list management for parallel operations of polar codes. Generally, the described techniques provide for addressing run-time issues and other considerations of data structure reorganization operations executed while decoding a polar code. A receiving entity (e.g., a user equipment or a base station) may partition an array, or other data structure, into sections. The array may be used during a decoding operation of a polar code. As the array is populated with data, each section may be organized and a permutation pattern calculated for each section. Upon identifying a list traversal event, the entire array may be reorganized section by section according to the permutation patterns determined for each section. Such reorganization techniques may result in lower latency of the overall decoding operation.

A method of for wireless communication is described. The method may include receiving a codeword over a wireless channel, the codeword being encoded using a polar code, determining bit channel metrics for a plurality of bit channels of the polar code based on the received codeword, partitioning an array of candidate path elements into one of more list sections, the array of candidate path elements comprising a first dimension associated with a list size for decoding of the received codeword and a second dimension associated with a length of the plurality of bit channels, performing a list traversal over the plurality of bit channels based on path metrics derived from the bit channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit channel of the each list section, reorganizing the array of candidate path elements based on the sectional permutation patterns such that each of the plurality of candidate paths comprises a vector of the array of candidate path elements aligned in the first dimension, and outputting at least one of the plurality of candidate paths.

An apparatus for wireless communication is described. The apparatus may include means for receiving a codeword over a wireless channel, the codeword being encoded using a polar code, means for determining bit channel metrics for a plurality of bit channels of the polar code based on the received codeword, means for partitioning an array of candidate path elements into one or more list sections, the array of candidate path elements comprising a first dimension associated with a list size for decoding of the received codeword and a second dimension associated with a length of the plurality of bit channels, means for performing a list traversal over the plurality of bit channels based on path metrics derived from the bit channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit channel of the each list section, means for reorganizing the array of candidate path elements based on the sectional permutation patterns such that each of the plurality of candidate paths comprises a vector of the array of candidate path elements aligned in the first dimension, and means for outputting at least one of the plurality of candidate paths.

Another apparatus for wireless communication is described. The apparatus may include a processor, memory in electronic communication with the processor, and instructions stored in the memory. The instructions may be operable to cause the processor to receive a codeword over a wireless channel, the codeword being encoded using a polar code, determine bit channel metrics for a plurality of bit channels of the polar code based on the received codeword, partition an array of candidate path elements into one or more list sections, the array of candidate path elements comprising a first dimension associated with a list size for decoding of the received codeword and a second dimension associated with a length of the plurality of bit channels, perform a list traversal over the plurality of bit channels based on path metrics derived from the bit channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit channel of the each list section, reorganize the array of candidate path elements based on the sectional permutation patterns such that each of the plurality of candidate paths comprises a vector of the array of candidate path elements aligned in the first dimension, and output at least one of the plurality of candidate paths.

A non-transitory computer readable medium for wireless communication is described. The non-transitory computer-readable medium may include instructions operable to cause a processor to receive a codeword over a wireless channel, the codeword being encoded using a polar code, determine bit channel metrics for a plurality of bit channels of the polar code based on the received codeword, partition an array of candidate path elements into one or more list sections, the array of candidate path elements comprising a first dimension associated with a list size for decoding of the received codeword and a second dimension associated with a length of the plurality of bit channels, perform a list traversal over the plurality of bit channels based on path metrics derived from the bit channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit channel of the each list section, reorganize the array of candidate path elements based on the sectional permutation patterns such that each of the plurality of candidate paths comprises a vector of the array of candidate path elements aligned in the first dimension, and output at least one of the plurality of candidate paths.

Some examples of the method, apparatus, and non-transitory computer-readable medium described above may further include processes, features, means, or instructions for identifying a list traversal event, wherein the reorganizing the array of candidate path elements based on the sectional permutation patterns may be based at least in part on the identifying the list traversal event.

In some examples of the method, apparatus, and non-transitory computer-readable medium described above, the list traversal event comprises a parity check operation or a termination of the list traversal.

In some examples of the method, apparatus, and non-transitory computer-readable medium described above, the reorganizing the array of candidate path elements based on the sectional permutation patterns comprises: reorganizing, based at least in part on a respective sectional permutation pattern of a given list section, the candidate path elements associated with each list section having a lower list section index than the given list section.

In some examples of the method, apparatus, and non-transitory computer-readable medium described above, the performing the list traversal comprises: reorganizing, for each bit channel of a given list section, the candidate path elements within the given list section having a lower bit channel index based on the selecting of the path metrics associated with the candidate paths for the each bit channel.

Some examples of the method, apparatus, and non-transitory computer-readable medium described above may further include processes, features, means, or instructions for performing an error check operation on the at least one of the plurality of candidate paths.

In some examples of the method, apparatus, and non-transitory computer-readable medium described above, the first dimension comprises rows of the array of candidate path elements and the second dimension comprises columns of the array of candidate path elements.

In some examples of the method, apparatus, and non-transitory computer-readable medium described above, the determining of at least one bit channel metric for at least one of the plurality of bit channels of the polar code may be performed after at least one operation of the list traversal.

Some examples of the method, apparatus, and non-transitory computer-readable medium described above may further include processes, features, means, or instructions for identifying a progress index for the determining of the bit channel metrics. Some examples of the method, apparatus, and non-transitory computer-readable medium described above may further include processes, features, means, or instructions for performing the list traversal for one or more of the list sections based at least in part on the progress index.

DETAILED DESCRIPTION

Error correcting codes (e.g., polar codes) may be computationally complex and may therefore utilize large amounts of resources (e.g., time, energy, processing power, etc.). For example, decoding techniques for some error correcting codes (e.g., list decoding) may include complex procedures for reorganizing data structures that may result in long computation run-times. Thus, as the number elements N in the array increases, the computational run-time for the reorganization procedures may increase rapidly (e.g., in proportion to N squared).

Techniques are described to address run-time issues and other considerations of data structure reorganization operations executed while decoding a polar code. A receiving entity (e.g., a user equipment or a base station) may use an array, or other data structure, of path elements for list traversal. The array may include L×N path elements, where L is the list size and N is the number of bit-channels in the polar code. The entity may partition the array into sections of bit-channels. As the array is populated with hard bit information for each of the L paths, each section may be organized by path metrics and a permutation pattern calculated for each section. Upon identifying a section reorganization event, the array or a subsection of the array may be reorganized according the permutation patterns determined for each section. Such reorganization techniques may result in lower latency of the overall decoding operation.

Aspects of the disclosure are initially described in the context of a wireless communications system. Aspects of the disclosure are illustrated by flow charts and array structures. Aspects of the disclosure are further illustrated by and described with reference to apparatus diagrams, system diagrams, and flowcharts that relate to list management for parallel operations of polar codes.

Figure 1:
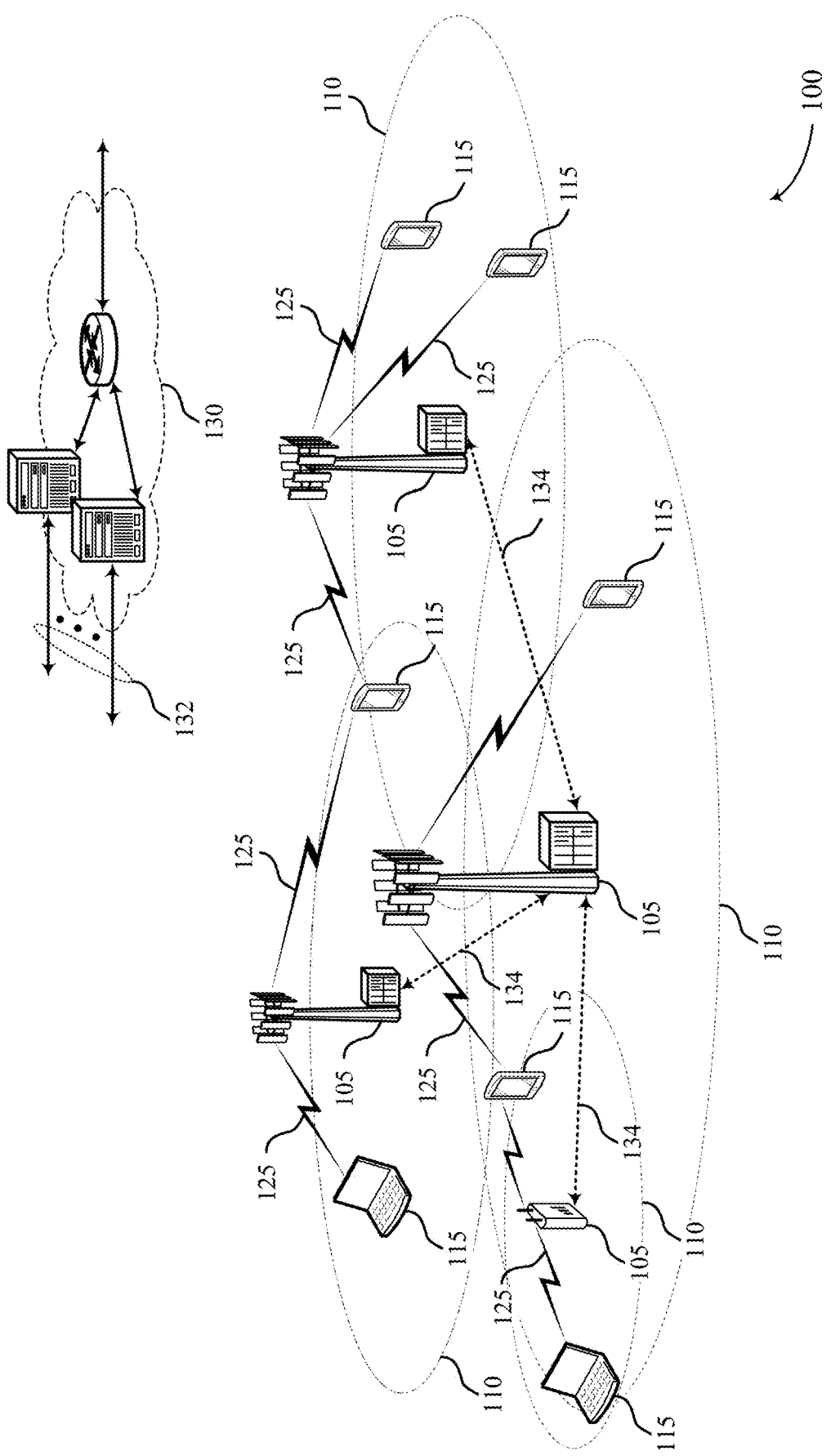
FIG. 1 illustrates an example of a system for wireless communication that supports list management for parallel operations of polar codes in accordance with aspects of the present disclosure.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices. A polar code decoder may employ list decoding, whereby multiple candidate paths are maintained and checked against an error detecting code to determine a successful decoding of information bits. When employing a list decoder, an entity may use one or more data structures to store bit-channel values and to identify candidate paths. According to various aspects described herein, the data structure used during the decoding operation may be partitioned into sections. Permutation of path elements may be performed within each section based on path metrics such that candidate paths are organized within each section. In addition, permutation patterns may be determined for each section without propagation of the permutations of individual bit-channels of a given section to previous sections. Subsequently, the permutation patterns may be used to organize the entire data structure section by section such that information in the data structure may be more easily retrieved. Such techniques may improve the run-time of the decoding operation.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink or downlink channel according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a mobile unit, a subscriber station, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105-a may include subcomponents such as an access network entity 105-b, which may be an example of an access node controller (ANC). Each access network entity 105-b may communicate with a number of UEs 115 through a number of other access network transmission entities 105-c, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra high frequency (UHF) region using frequency bands from 300 MHz to 3 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. Wireless communications system 100 may also operate in a super high frequency (SHF) region using frequency bands from 3 GHz to 30 GHz, otherwise known as the centimeter band. In some cases, wireless communications system 100 may also utilize extremely high frequency (EHF) portions of the spectrum (e.g., from 30 GHz to 300 GHz), also known as the millimeter band. Systems that use this region may be referred to as millimeter wave (mmW) systems. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions. Techniques disclosed herein may be employed across transmissions that use one or more different frequency regions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the signals.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may use multiple antennas or antenna arrays for MIMO transmissions with one or more UEs 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARD) to provide retransmission at the MAC layer to improve link efficiency. In the control plane, the Radio Resource Control (RRC) protocol layer may provide establishment, configuration, and maintenance of an RRC connection between a UE 115 and a network device 105-c, network device 105-b, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each orthogonal frequency division multiplexing (OFDM) symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both frequency division duplexing (FDD) and time division duplexing (TDD) component carriers.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on FDD, TDD, or a combination of both.

Figure 2:
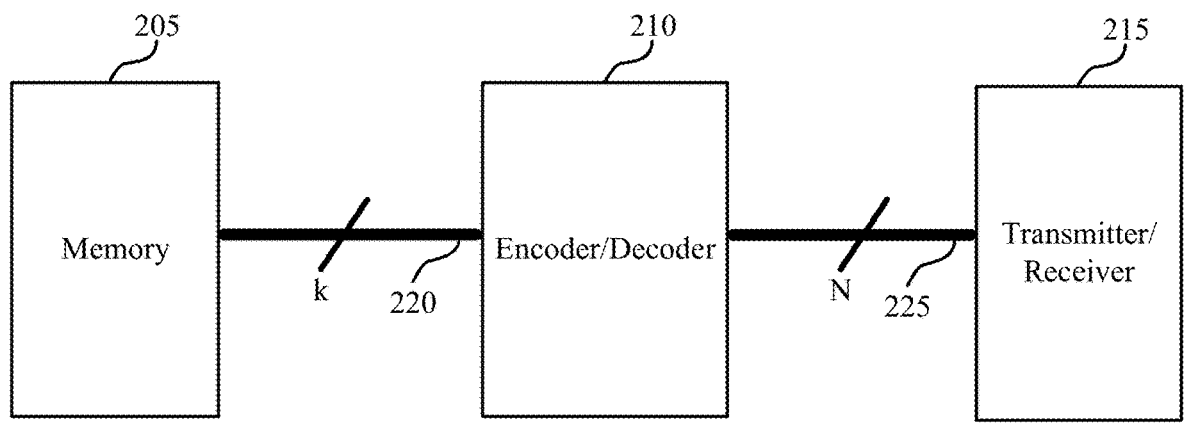
FIG. 2 illustrates an example of a device that supports list management for parallel operations of polar codes in accordance with aspects of the present disclosure.

FIG. 2 illustrates an example of a device 200 that supports list management for parallel operations of polar codes in accordance with various aspects of the present disclosure. Device 200 may include memory 205, encoder/decoder 210, and transmitter/receiver 215. Bus 220 may connect memory 205 and encoder/decoder 210, and bus 225 may connect encoder/decoder 210 and transmitter/receiver 215. In some instances, device 200 may have data stored in memory 205 to be transmitted to another device, such as, a UE 115 or a base station 105. To initiate data transmission, device 200 may retrieve the data, including information bits, from memory 205 for the transmission. The information bits included in memory 205 may be passed on to encoder/decoder 210 via bus 220. The number of information bits may be represented as a value k, as shown.

Encoder/decoder 210 may encode the k information bits and output a codeword having a length N, where k<N. Parity bits may be used in some forms of outer codes to provide redundancy to protect information bits, and frozen bits may be denoted by a given value (0, 1, etc.) known to both the encoder and the decoder (i.e., the encoder encoding information bits at a transmitter, and the decoder decoding the codeword received at a receiver). From a transmitting device perspective, device 200 may encode information bits to produce a codeword, and the codeword may be transmitted via transmitter 215. For a receiving device perspective, device 200 may receive encoded data (e.g., a codeword) via receiver 215 and may decode the encoded data using decoder 210 to obtain the information bits.

As mentioned above, device 200 may generate a codeword of length N and dimensionality k (corresponding to the number of information bits) using a polar code. A polar code is an example of a linear block error correcting code and is the first coding technique to provably achieve channel capacity. That is, polar codes may increase the probability of a successful transmission for a given code rate. For encoding using a polar code, a transmitting device may identify a number of information bits for a transmission (e.g., of an information bit vector), and the transmitting device may allocate or distribute the information bits to polarized bit-channels based on the capacity of the bit-channels. As such, the information bits may be loaded on the polarized bit-channels associated with the highest reliability metrics, and the remaining bits (e.g., frozen bits) may be loaded on the remaining polarized bit-channels. Relative channel capacity for bit-channels of a polar code may be determined in various ways including using polarization weight, density evolution, or recursive application of mutual information. Some polar coding techniques (e.g., parity check polar codes) may also input parity information to some bit-channels based on channel capacity (e.g., bit-channels having relatively lower capacity than bit-channels used for information bits, but relatively higher capacity than bit-channels used for frozen bits). A decoder may use the same technique as the encoder for identifying the locations of the information bits on bit-channels of the polar code. In some examples, puncturing may be used for rate matching for a desired code rate or transmitted codeword length. Puncturing a first (lowest index) set of channel indices may be known as unknown bit puncturing or non-shortening based puncturing. Puncturing successive bits may be known as block puncturing. In other examples, shortening based puncturing may be used, which also may be known as known bit puncturing. In shortening based puncturing, a set of bit-channel indices output by the polar encoder having the highest indexes may be punctured, with corresponding inputs of the punctured bit-channels set to a known value. The reliability metrics for each bit-channel may be determined taking the puncturing into account.

For decoding a polar code, a receiving device may identify bit-channel metrics for a number of bit-channels based on a received codeword. During a list traversal operation, path elements corresponding to the bit-channels may be stored in a data structure, such as an array. The list traversal operation may reorganize the data structure such that candidate paths are along a given dimension of the array. Reorganizing the data structure may be one factor that contributes to the latency of the decoding operation. According to described aspects, the data structure may be partitioned into sections. During list traversal, reorganizing based on path metrics determined at a bit-channel of a section may be performed within the section but not across sections, with permutation patterns maintained for each section. Subsequently, a second reorganizing step may be applied to the entire data structure using the permutation patterns. The second reorganizing step may align candidate paths along a given dimension for retrieval and processing (e.g., error checking, etc.). The second reorganizing step may be broken into multiple operations, each operation reorganizing based on a subset of the permutation patterns.

Figure 3:
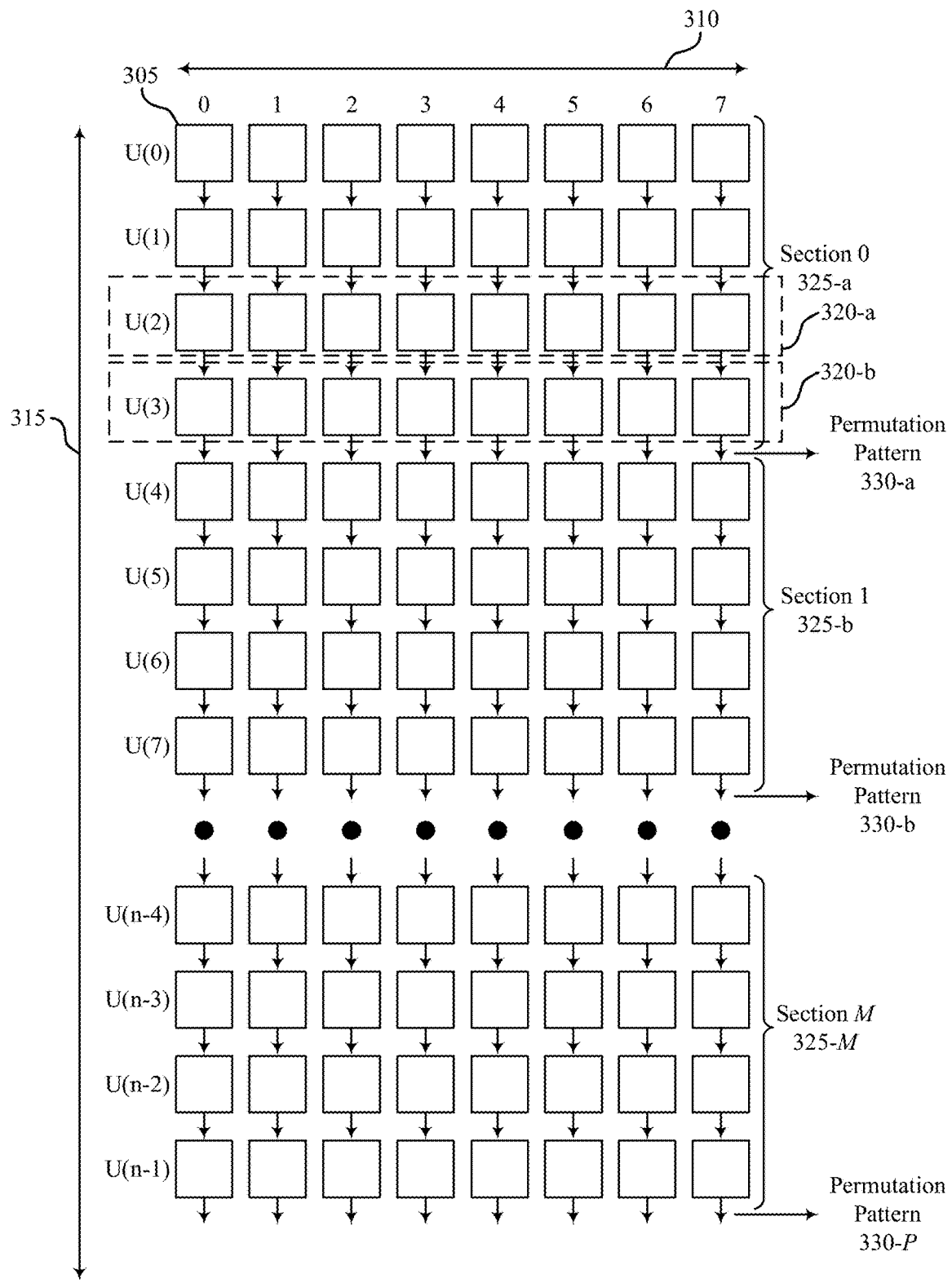
FIG. 3 illustrates an example of an array that supports list management for parallel operations of polar codes in accordance with aspects of the present disclosure.

FIG. 3 illustrates an example of an array 300 that supports list management for parallel operations of polar codes in accordance with various aspects of the present disclosure. The array 300 may store a list of candidate paths used during a decoding operation of a polar code. Array management, sometimes referred to as list management, may be used during a decoding operation of a polar code. For example, as a decoding operation traverses a candidate path tree to determine hard bits for each bit-channel, certain candidate paths may be kept and others discarded. List management, in some examples, may contribute to an overall latency of a polar list decoding operation.

The complexity of a list management operation may be determined by multiple factors such as the complexity of the procedures of the operation, the ability to parallelize certain procedures of the operation, and/or the data structure (e.g., the array structure) being used in the operation. Complexity of the operation relates, in many instances, to the run-time or latency of the operation. In some examples, performance improvements of polar list decoding operations (sometimes referred to as polar code decoding operations) may be desirable because the amount of data being communicated using polar codes is increasing. For example, in some wireless communications systems, polar code lengths of N=512 or N=1024 may be used for some signaling. As N grows, so does the run-time latency of a polar list decoding operation.

Techniques are described herein to manage the array structure that may reduce the run-time (e.g., latency) of the operation. In some examples, performance of polar list management using the present techniques may exhibit a Big O value of O(N) as compared to a Big O value of $O(N^2)$ for other list management techniques.

In a wireless communications context, a receiving entity (e.g., base station 105 or UE 115) may receive a codeword that was encoded using a polar code. After receiving such a codeword, the receiving entity may initiate polar list decoding operation. As part of such a decoding operation, the receiving entity may initialize memory space with an array structure or a list structure (e.g., array 300). The receiving entity may also select (and optionally sort) list candidates, append data to the selected candidates (e.g., tag information, time stamp) store the selected candidates in the array structure, and update the array structure based on the selected list candidates. The array 300 is an array structure that may be used to store and organize list candidates in a polar list decoding operation.

List decoding may generate and arrange a plurality of path elements 305 in the array 300. In the illustrative example, the array 300 is a two-dimensional array of path elements 305. In other examples, however, the array 300 may be a three-dimensional data structure. In some cases, the array may be implemented by a predefined physical memory structure having accessible dimensions corresponding to the dimensions of array 300. In some other instances, array 300 may be implemented using a variety of compiled or dynamically allocatable memory structures such as a stack, a heap, and the like.

The array 300 may have a first dimension 310 and a second dimension 315. The first dimension 310 may be associated with a list size of a list decoding operation. In some examples, first dimension 310 corresponds to a number of columns of the array 300. The second dimension 315 may be associated with the number of bit-channels in the polar code (e.g., N). In some examples, the second dimension 315 corresponds to the number of rows in the array 300. While the first dimension 310 and the second dimension 315 are discussed in terms of and the number of columns and number of rows in the array 300, respectively, in other examples the first dimension 310 may correspond to the number of rows or some other type of data structure index and the second dimension may correspond to the number of columns or some other type of data structure index.

As is discussed in more detail below, a list traversal operation may be performed to determine candidate paths from the bit-channel metrics associated with the bit-channels U. For example, at each bit-channel U(n−1) (e.g., bit-channel U(2) 320-a), the list traversal operation may have L candidate paths (L=8 in the illustrated example), where each candidate path includes one path element corresponding to each bit-channel up to and including bit-channel U(n−1). Each candidate path may be associated with a path metric, which may be the accumulation of bit-channel metrics for each bit-channel up to and including bit-channel U(n−1). For bit-channel U(n) (e.g., bit-channel U(3) 320-b), the number of candidate paths doubles (for the two possible hard bit outcomes of the bit-channel U(n)). The L best candidate paths may then be identified from the 2*L candidate paths based on the path metrics up to and including bit-channel U(n). The path elements 305 corresponding to the L best paths may then be stored in the row corresponding to bit-channel U(n), with the other path elements being discarded. In some examples, the path elements 305 corresponding to the L best paths may be stored in the row corresponding to bit-channel U(n) in an unsorted order, with the other path elements being discarded. As such, the L best paths may be selected but not sorted before being stored in the row corresponding to bit-channel U(n). In other examples, the path elements 305 corresponding to the L best paths may be stored in a sorted order (e.g., with index 7 of the columns of the array 300 being the path element corresponding to the best path). Selection of the path elements corresponding to the L best paths for each bit-channel disorganizes the candidate paths within the array 300, thus making it more difficult to extract desired information from the array 300. As such, polar list management operations may also include procedures to reorganize the array 300 based on the sorted path elements for each candidate path.

One possible method is to re-organize, at each bit-channel U(n), each previous bit-channel such that the path elements for each candidate path have a same index in the first dimension. Each reorganizing operation may include deciding, for each of the previously stored candidate paths, whether the candidate survives, the candidate needs duplication for the previously stored path elements from one column of the array to another, or the candidate path needs to be overwritten by another candidate path for the previously stored path elements. The reorganization decides source and destination columns and duplicating previously stored path elements from the source columns to the destination ones. In addition, the columns may be shuffled even if the candidate paths are the same as from a previous bit-channel index. Thus, a permutation may be determined for bit-channel U(n) that represents the sorting of candidate paths at bit-channel U(n) relative to bit-channel U(n−1), and the permutation may be applied to the path elements corresponding to each prior bit-channel (e.g., each prior row). The number of reorganizations performed using this technique may be, for example $\Sigma_{i=0}^{N-1} i$. Another possible method is to maintain a linked list for each candidate path. While a linked list eliminates organization of path elements during list traversal, retrieving candidate paths using a linked-list structure suffers from significant complexity because the linked-list must be traversed to retrieve path elements for each candidate path. In addition, each path element requires a larger data structure to store the reference operation for linked-list traversal, thus taking up more storage area and run-time complexity to manage the additional data structure elements. In some cases, candidate paths are traversed frequently (e.g., parity check polar codes), and therefore additional complexity for retrieving candidate paths using a list linked structure will be compounded.

In some cases, the present techniques may partition the array 300 into sections 325. Permutation patterns associated with the sections may be used during a reorganization of the array 300. In some cases, partitioning the array 300 into sections 325 may reduce the run-time of a decoding operation of a polar code. In some cases, the array 300 may not be divided into sections. In such cases, the entire array 300 may comprise a single section and the functions, procedures and operations described in the context of the sections may be applied to the array 300 as a whole or, said another way, may be applied to an array that includes one section.

Certain types of reorganizing algorithms may be applied to individual sections and other types of reorganizing algorithms may be applied to the entire array 300. Each section may include an associated permutation pattern 330. The array 300 may include any number of sections 325 (e.g., M sections, where each section has N/M bit-channels). In some examples, the array may be broken into equal sized sections 325. In other examples, some of the sections 325 of the array may have different sizes.

During a polar list traversal operation, portions of processing may be applied to a section 325 of the array 300 without being applied to the entire array 300. In some examples, a permutation pattern 330 may be computed for each section 325. By applying certain procedures only within sections 325 and by applying other procedures to the entire array 300 using permutation patterns, the run-time of particular operations and/or procedures may be reduced, as compared to operations and/or procedures applied to the entire array 300.

Each section 325 may be a sub-division of the array 300. Each section 325 may have a first dimension that is equal to the first dimension 310 of the array 300 and a second dimension that is less than the second dimension 315 of the array 300. In some examples, each section 325 is the same size as all of the other sections 325. In other examples, sections 325 may have different sizes as compared to other sections 325 in the same array 300 (e.g., a first section 325 may include five rows, while a second section 325 may include four rows). Each section 325 may be associated with a permutation pattern 330.

Figure 4:
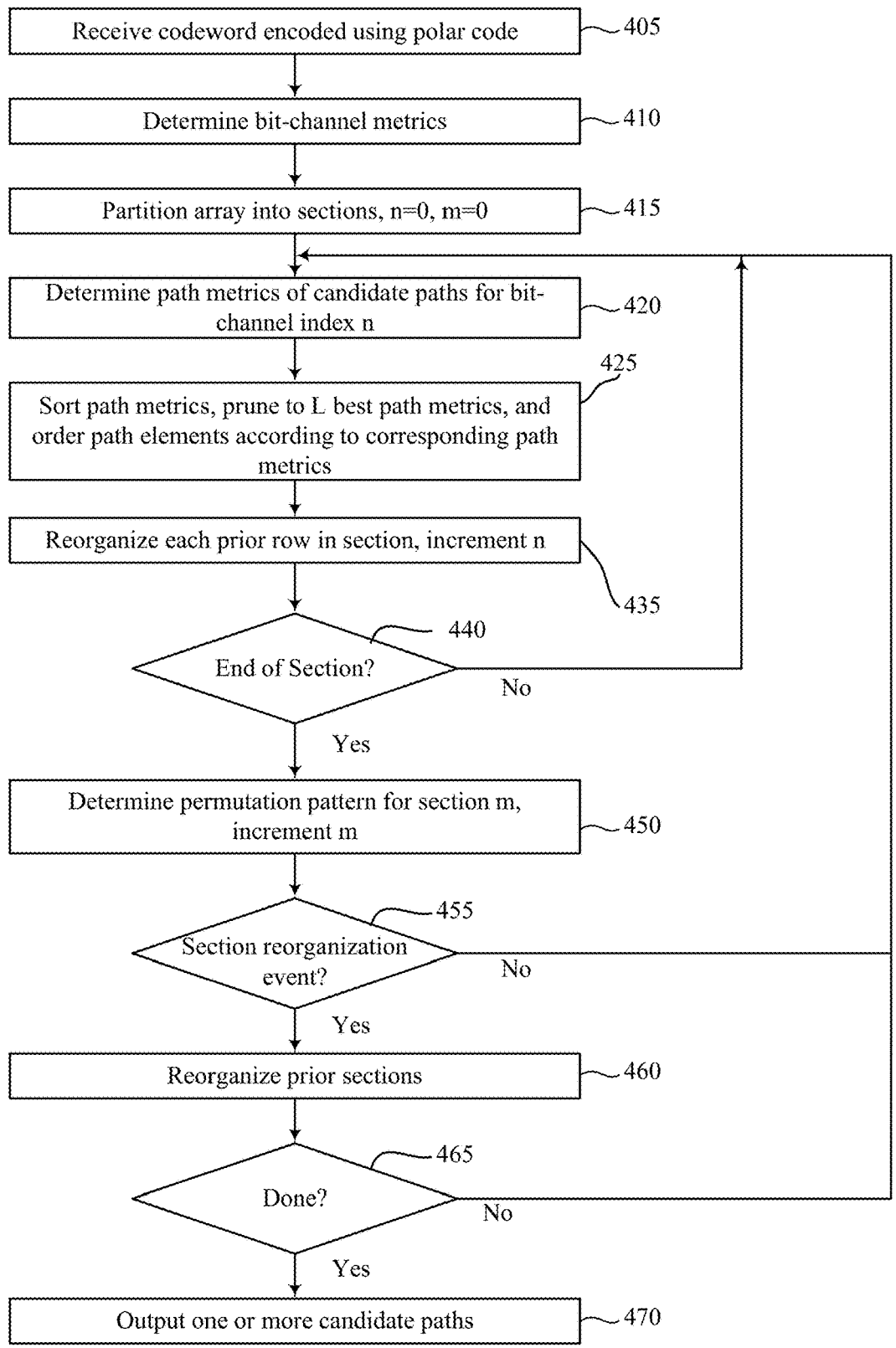
FIG. 4 illustrates an example of a flow chart that supports list management for parallel operations of polar codes in accordance with aspects of the present disclosure.

FIG. 4 illustrates an example of a flow chart 400 that supports list management for parallel operations of polar codes in accordance with various aspects of the present disclosure. The flow chart 400 may be an example of at least a portion of a polar list decoding operation. The processes and functions illustrated by the flow chart 400 may be performed by a receiving entity (e.g., decoder) in a wireless communications system. The receiving entity may be a UE 115 or a base station 105.

At block 405, the decoder may receive a codeword encoded using a polar code. The codeword may be received over a wireless channel in a wireless communications system (e.g., a communication link 125). Upon determining that the codeword was encoded with a polar code, the decoder may initiate a polar list decoding operation.

At block 410, the decoder may determine an initial set of bit-channel metrics for bit-channels of the polar code. For example, the bit-channel metrics may be determined based on single parity check decoding operations (e.g., F operations) and repetition decoding operations (e.g., G operations) performed recursively over each layer of the polar code based on demapped symbols of the received codeword (e.g., input log-likelihood ratios (LLRs)). Each bit-channel metric may represent an LLR value corresponding to a bit value of 0 and an LLR value corresponding to a bit value of 1.

At block 415, the decoder may partition an array (e.g., array 300) into sections (e.g., sections 325). The array may be structured as N rows of L columns, where N is the polar code length and L is the list size. Some procedures of the polar list decoding operation may be applied to single sections. In some cases, the procedures of the polar list decoding, including procedures that may be applied on a section-by-section basis, may be configured to reduce the overall run-time of the polar list decoding operation. In some examples, the decoder may initialize a bit-channel index counter n and a section counter m.

At block 420, the decoder may determine path metrics for candidate paths for the bit-channel index n. A path metric may include bit-channel metrics for each bit-channel in a candidate path. As used herein, a candidate path may refer to a chain of path elements corresponding to each bit-channel from an initial bit-channel (e.g., at U(0)) to a current bit-channel (e.g. at U(n)). A path metric may be an accumulation of the individual bit-channel metrics along the candidate path. For example, a first bit-channel metric for a hard bit value of '0' for U(0) may be 0.9 and a second bit-channel metric for a hard bit value of '0' for U(1) may be 0.85. If the candidate path includes hard bit values of '00' for bit-channels U(0) and U(1), the path metric may be 0.9+0.85. Thus, for a bit-channel index n, the path metrics are the accumulated path metrics for candidate paths that have been selected at prior sorting and pruning operations as well as the bit-channel metrics of bit-channel U(n).

At block 425, the decoder may prune the list of candidate paths to the L best paths. The decoder may store the path elements corresponding to the L best paths in the row of the array corresponding to the bit-channel index n. In some instances, the decoder may order the path elements in the row of the array corresponding to the bit-channel index n based on the sorted path metrics corresponding to each path element.

At block 435, the decoder may reorganize each prior row in the section based on the permutation of path elements from row n−1 to row n. Thus, where each section includes N/M rows, where M is the number of sections, there will be $$\sum_{i=0}^{\frac{N}{M}-1}$$

i reorganizing operations per section. bit-channel index n may also be incremented at 435.

Figure 5:
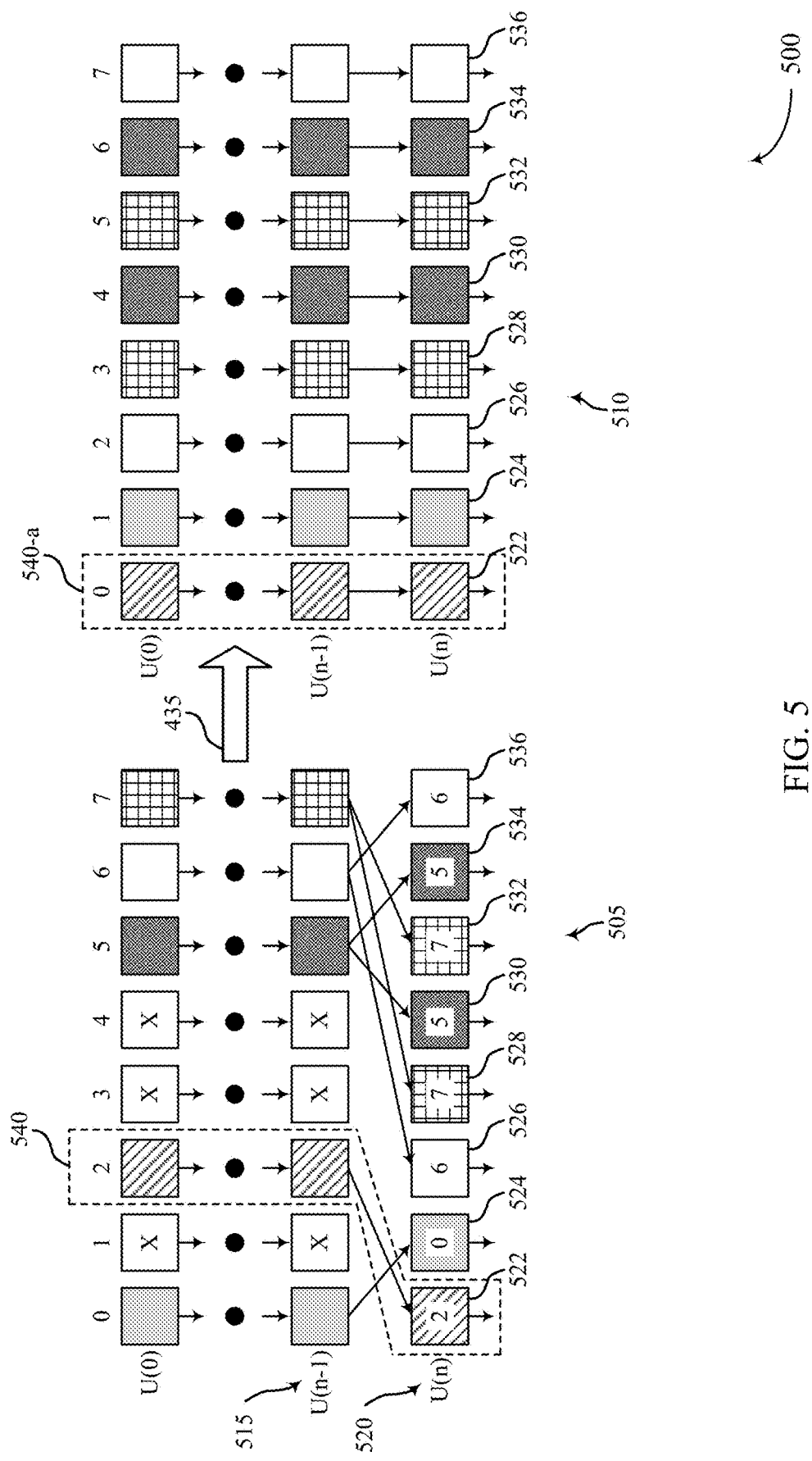
FIG. 5 illustrates an example of a section of an array that supports list management for parallel operations of polar codes in accordance with aspects of the present disclosure.

FIG. 5 illustrates an example of a reorganization process within a section of a list decoding data structure. FIG. 5 illustrates an example of a section 500 of an array that supports list management for parallel operations of polar codes in accordance with various aspects of the present disclosure. FIG. 5 includes a before-reorganization representation 505 and an after-reorganization representation 510 of the section 500. As shown in representation 505, the path elements of the section up to bit-channel U(n−1) are organized such that each of the candidate paths is aligned (e.g., within a given column) of the array. A new set 520 of path elements for bit-channels U(n) has been selected and ordered based on corresponding path metrics. The new set of path elements (e.g., corresponding to bit-channel U(n)) may include a first path element 522, a second path element 524, a third path element 526, a fourth path element 528, a fifth path element 530, a sixth path element 532, a seventh path element 534, and an eighth path element 536.

The individual path elements 522-536 of the new set 520 correspond to candidate paths from bit-channel U(n−1) as shown by the arrows. For example, the first path element 522 may be derived from a candidate path that was in column 2 at bit-channel U(n−1). In another example, both the fifth path element 530 and the seventh path element 534 may be derived from a candidate path that was in column five at bit-channel U(n−1).

That is, some candidate paths at bit-channel U(n−1) may split into multiple candidate paths at bit-channel U(n) that survive pruning (e.g., candidate paths at columns five, six, and seven), some candidate paths at bit-channel U(n−1) may have a single corresponding path element at bit-channel U(n) (e.g., candidate paths at columns zero and two), and yet other candidate paths at bit-channel U(n−1) may not survive pruning at bit-channel U(n) (e.g., candidate paths at columns one, three, and four). In effect, after the sorting of path metrics for bit-channel U(n), the candidate paths that don't survive pruning will be replaced by candidate paths that had multiple paths at bit-channel U(n) that survived pruning (e.g., both hard bit values of '0' and '1' at bit-channel U(n) survive pruning).

The representation 505 also depicts a candidate path 540, which includes the first path element 522 at bit-channel U(n). While each path element 522-536 is associated with a candidate path, only the candidate path 540 is shown for clarity purposes. The candidate path 540 includes path elements from each bit-channel index.

Referring back to block 435 of FIG. 4, once the path elements at bit-channel U(n) are selected (and optionally sorted) according to corresponding path metrics, the decoder may reorganize the prior rows of the section to match the new order of the candidate paths for the selected path elements. As part of the reorganization, the candidate paths for each prior row in the section may be aligned with their respective path element in the new set 520. For example, as shown in the representation 510 illustrated in FIG. 5, the path elements in candidate path 540-*a* for each bit-channel index in the section up to index n−1 may be moved to be in the zero column with the first path element 522. Thus, the path elements (e.g., path elements for the candidate path in U(n−1) through U(0)) of the candidate path are aligned with the first path element 522. Similarly, the candidate paths for the other path elements 524-536 are also aligned with their respective path elements 524-536. In cases where a single candidate path in the current set 515 spawns two candidate paths in the new set 520, the candidate path may be duplicated and positioned to be aligned with each of their respective path elements 522-536. For example, in the representation 510, the candidate path in column 5 at bit-channel U(n−1) prior to reorganization based on path metrics for bit-channel U(n) is duplicated and the path elements for bit-channels U(0) through U(n−1) in columns 4 and 6 are the same in representation 510. Such organization of each section 325 in the array 300 allows the array 300 to be more easily traversed to retrieve data.

In some examples, the reorganization procedures of block 435 may be performed in parallel. In such examples, the path elements at each bit-channel index may be aligned at the same time (e.g., in concurrent operations). In some examples, the run-time of the reorganization procedures of block 435 may be related to the number of bit-channels in a section in a non-linear fashion. For example, if a candidate path 540 includes four path elements, the run-time for the reorganization procedure may be a duration of X. However, if a candidate path 540 includes eight path elements, the run-time for the reorganization procedure may be greater than 2X. Hence, in some examples, there may exist a non-linear relationship between the number of elements being reorganized and a run-time of the reorganization procedure.

At block 440, the decoder may determine if it has reached the end of the section. Where the end of the section is not reached, the decoder may return to block 420 to determine path metrics for bit-channel index n. Where the end of the section has been reached, the decoder may determine a permutation pattern for section m at block 450. The permutation pattern for section m may be the nested permutations at each bit-channel index of the section. That is, where a permutation of bit-channel index y relative to bit-channel index x is Px,y, and a permutation of bit-channel index z relative to bit-channel index y is Py,z, it can be shown that Px,z(.)=Py,z(Px,y(.)), for x<y<z. The permutation pattern for section m may be stored and the section counter m may be incremented.

At block 455, it may be determined if a section reorganization event has occurred. If no section reorganization event has occurred, the decoder may return to block 420 to determine path metrics for bit-channel index n of the next section m. If a section reorganization event has occurred at block 455, the prior sections may be reorganized using the permutation patterns at block 460.

Figure 6:
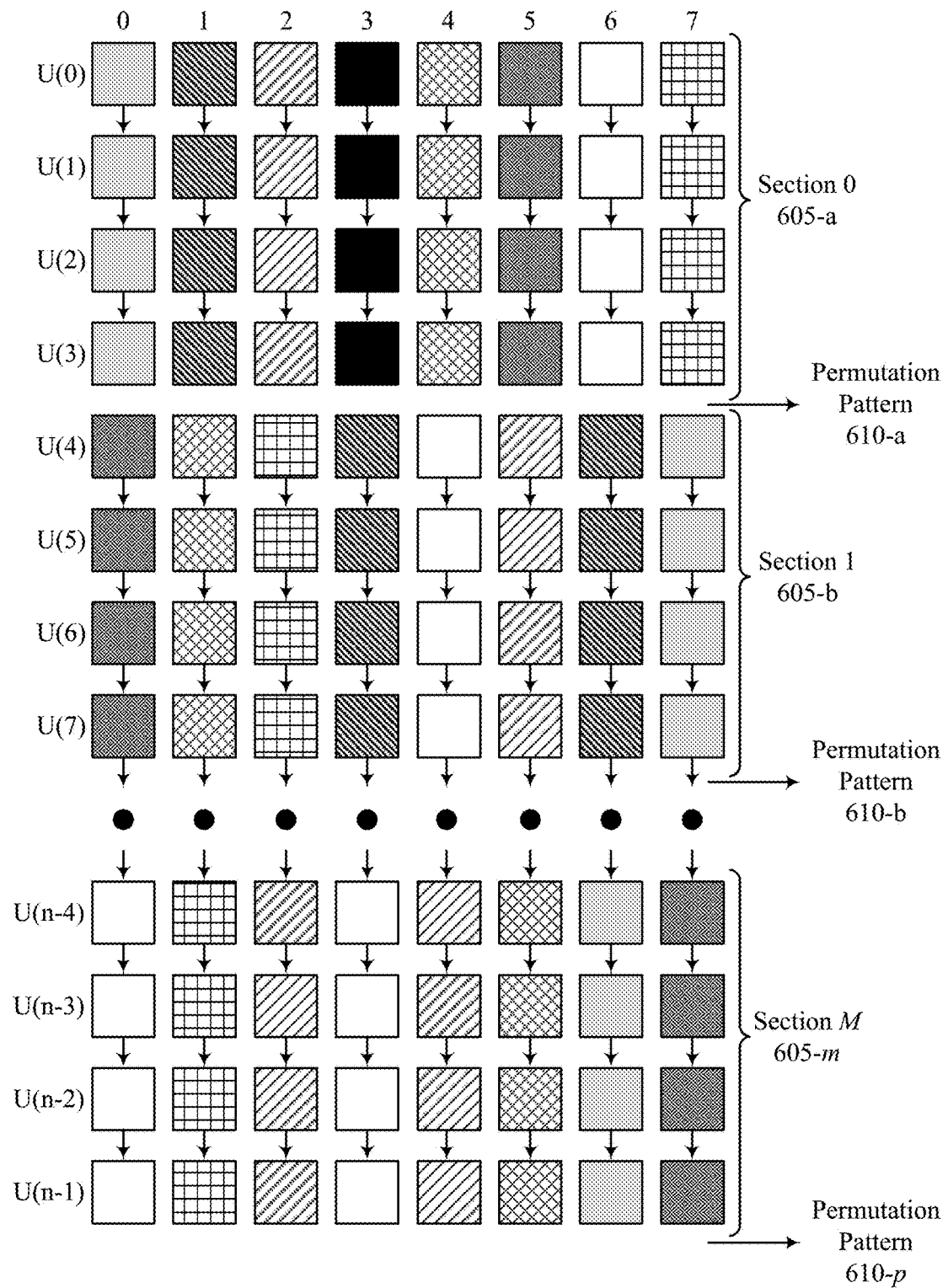
FIG. 6 illustrates an example of an array that supports list management for parallel operations of polar codes in accordance with aspects of the present disclosure.

FIG. 6 illustrates an example of an array 600 that includes a plurality of sections 605. The array 600 may be an example of the array 300 described with reference to FIG. 3 and sections 605 may be examples of the sections 325. FIG. 6 may illustrate the sections at the end of list traversal of bit-channels U(0) to U(n−1). Each section 605 may include a plurality of path elements, organized according to the ordered path elements corresponding to the last bit-channel in the section 605. For example, the first section 605-*a* may be organized such that path elements for each candidate path are aligned according to path metrics for candidate paths as of bit-channel U(3). Similarly, the second section 605-*b* may be organized such that path elements for each candidate path are aligned according path metrics for candidate paths as of bit-channel U(7). However, as can be seen in FIG. 6, the path elements for candidate paths in section 605-*a* are not aligned with the path elements for corresponding candidate paths in section 605-*b* because the reorganization during list traversal occurs by section.

As the sections 605 of the array 600 are filled with path elements, permutation patterns 610 for each section 605 are determined. Thus, upon occurrence of the section reorganization event (e.g., at block 455 of FIG. 4), the decoder may have stored a permutation pattern 610 for each section 605 (e.g., permutation patterns 610-*a*, 610-*b*, 610-*p*). The permutation pattern 610 may be an example of the permutation patterns 330 described with reference to FIG. 3. In some examples, the permutation pattern 610 may be structured data indicating the relationship. For example, the permutation pattern 610-*b* may be the number 54716210, where each digit associates the permutation of a respective column at the end of the section relative to the beginning of the section. In this example, column 4 at the end of the section corresponds to the candidate path in column 6 at the beginning (e.g., the last bit-channel of the previous section). The permutation patterns 610 may take on other forms, in some examples.

Upon occurrence of the section reorganization event, the decoder may reorganize the sections prior to a current bit-channel that is associated with the section reorganization event. For example, the section reorganization event may be triggered based on a parity check operation of a subset of bit-channels, when a threshold bit-channel for list traversal is reached, or may be triggered when the list traversal is complete (e.g., has reached bit-channel N−1). In the example illustrated in FIG. 6, the section reorganization event is the completion of list traversal. Reorganizing the sections 605 may include applying each permutation pattern to each previous section. That is, a permutation pattern for a given section m may be applied to each of the sections up to and including section m−1. Thus, the permutation pattern for section 1 may be applied to section 0, the permutation pattern for section 2 may be applied to sections 1 and 0, the permutation pattern for section 3 may be applied to sections 2, 1, and 0, and so on. In some cases, the permutation patter 610-*a* associated with the first section 605-*a* may not be applied, or may not be generated.

In some examples, a progress index may be maintained which reflects the bit-channel index or section index for which the permutation patterns have been applied (e.g., the permutation patterns have been applied below the progress index). For example, where a first section reorganization event occurs prior to completion of the list traversal, the sections up to a given bit-channel index may be reorganized and the progress index may be updated with the given bit-channel or section index. Where a second section reorganization event occurs (e.g., completion of the list traversal), the permutation patterns up to the progress index do not need to be applied again while the permutation patterns of those sections after the progress index may be applied.

Figure 7:
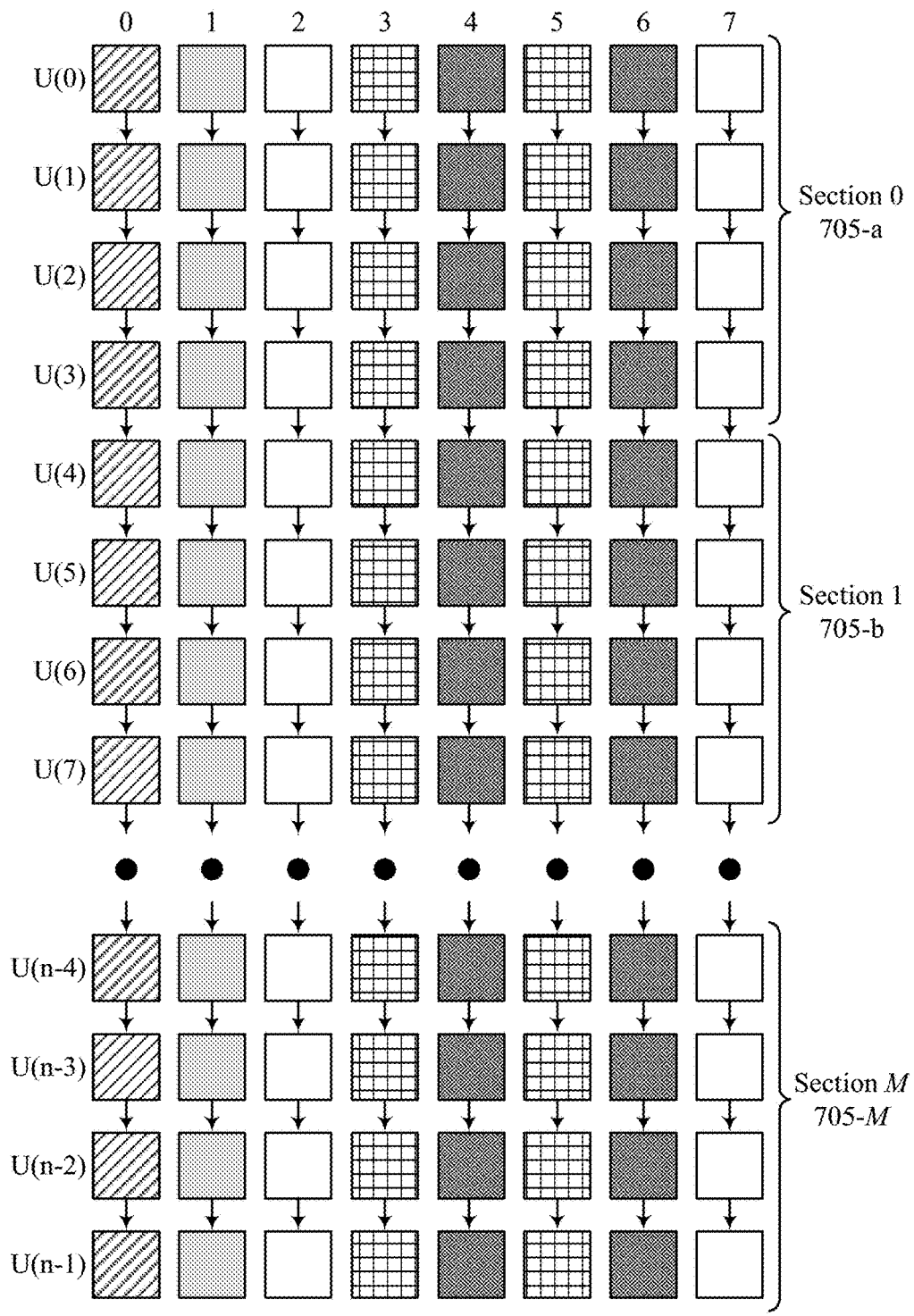
FIG. 7 illustrates an example of an array that supports list management for parallel operations of polar codes in accordance with aspects of the present disclosure.

After the sectional reorganization has been performed, the path elements up to the progress index will be aligned (e.g., within the same column) for each candidate path. FIG. 7 illustrates an example of an array 700 that has been reorganized based on the occurrence of a section reorganization event. The path elements for each of the candidate paths for each bit-channel are aligned in the first dimension (e.g., as columns of the array 700).

Referring back to FIG. 4, the decoder may determine whether the identified section reorganization event was at completion of the list traversal operation. If there are more bit-channels for list traversal, the decoder may return to block 420 to determine path metrics for bit-channel index n of the next section m. If the section reorganization event was at completion of the list traversal, the decoder may proceed to block 470 to perform error checking on the candidate paths.

Using sectional reorganization, the total number of reorganization operations may be, for example $$\sum_{i=0}^{\frac{N}{M}-1} i \cdot M + \sum_{j=0}^{M-2} j \cdot \frac{N}{M}.$$

Because each section 605 is organized internally based on the path metrics corresponding to the last bit-channel of the section, entire subsets of bit-channels in the section 605 may be reorganized based on the permutation pattern 610. For example, entire columns of bit-channels in a given section 605 may be reorganized all at once using the permutation pattern 610 associated with that given section. In some examples, the sectional reorganization procedures may be performed in parallel and the total number of reorganizations may approach $$\sum_{i=0}^{\frac{N}{M}-1} i \cdot M + \sum_{j=0}^{M-2} j.$$

In such examples, the path elements at corresponding bit-channels within each of multiple sections may be aligned at the same time (e.g., in concurrent operations).

At block 470, the decoder may perform error checking on one or more of the candidate paths determined using the polar list decoding operation. As part of outputting the candidate paths for error checking, the decoder may identify the candidate paths that are aligned within the array. For example, the decoder may read each candidate path as a vector of path elements aligned in the first dimension (e.g., aligned in a single column of the array). Such alignment may be based on executing array reorganization procedures using the permutation patterns as described above. In some examples, the decoder may select a subset of candidate paths on which to perform error checking. The selected candidate path(s) may represent the most likely values for the data encoded in the codeword. The list decoding operation may terminate when one candidate path has passed the error check operation.

Figure 8:
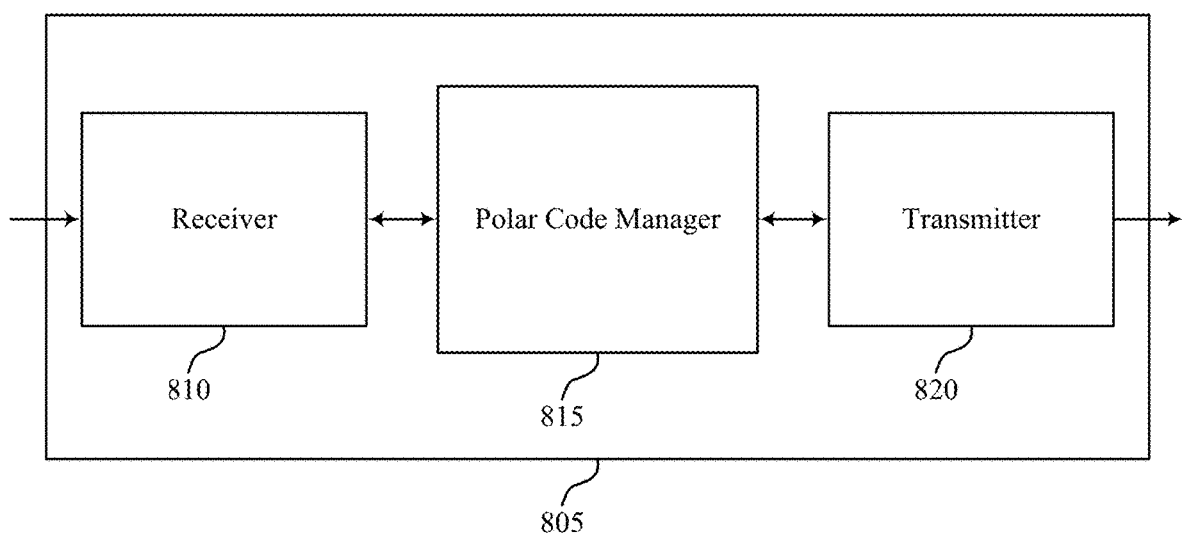
FIGS. 8 through 10 show block diagrams of a device that supports list management for parallel operations of polar codes in accordance with aspects of the present disclosure.

FIG. 8 shows a block diagram 800 of a wireless device 805 that supports list management for parallel operations of polar codes in accordance with aspects of the present disclosure. Wireless device 805 may be an example of a user equipment (UE) 115 or base station 105 as described with reference to FIG. 1. Wireless device 805 may include receiver 810, polar code manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to list management for parallel operations of polar codes, etc.). Information may be passed on to other components of the device. The receiver 810 may be an example of aspects of the transceiver 1135 described with reference to FIG. 11. The receiver 810 may utilize a single antenna or a set of antennas. Receiver 810 may receive a codeword over a wireless channel, the codeword being encoded using a polar code.

Polar code manager 815 may be an example of aspects of the polar code manager 1115 described with reference to FIG. 11. Polar code manager 815 and/or at least some of its various sub-components may be implemented in hardware, software executed by a processor, firmware, or any combination thereof. If implemented in software executed by a processor, the functions of the polar code manager 815 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The polar code manager 815 and/or at least some of its various sub-components may be physically located at various positions, including being distributed such that portions of functions are implemented at different physical locations by one or more physical devices. In some examples, polar code manager 815 and/or at least some of its various sub-components may be a separate and distinct component in accordance with various aspects of the present disclosure. In other examples, polar code manager 815 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Polar code manager 815 may determine bit-channel metrics for a set of bit-channels of the polar code based on the received codeword, and partition an array of candidate path elements into a set of list sections, the array of candidate path elements including a first dimension associated with a list size for decoding of the received codeword and a second dimension associated with a length of the set of bit-channels. Polar code manager 815 may perform a list traversal over the set of bit-channels based on path metrics derived from the bit-channel metrics to obtain a set of candidate paths. The list traversal may include determining a sectional permutation pattern for each list section, the sectional permutation pattern identifying a nested permutation of the candidate path elements over the each list section based on selecting the list size of candidate paths according to sorted path metrics for each bit-channel of the each list section. Polar code manager 815 may reorganize the array of candidate path elements based on the sectional permutation patterns such that each of the set of candidate paths includes a vector of the array of candidate path elements aligned in the first dimension, and output at least one of the set of candidate paths.

Transmitter 820 may transmit signals generated by other components of the device. In some examples, the transmitter 820 may be collocated with a receiver 810 in a transceiver module. For example, the transmitter 820 may be an example of aspects of the transceiver 1135 described with reference to FIG. 11. The transmitter 820 may utilize a single antenna or a set of antennas.

Figure 9:
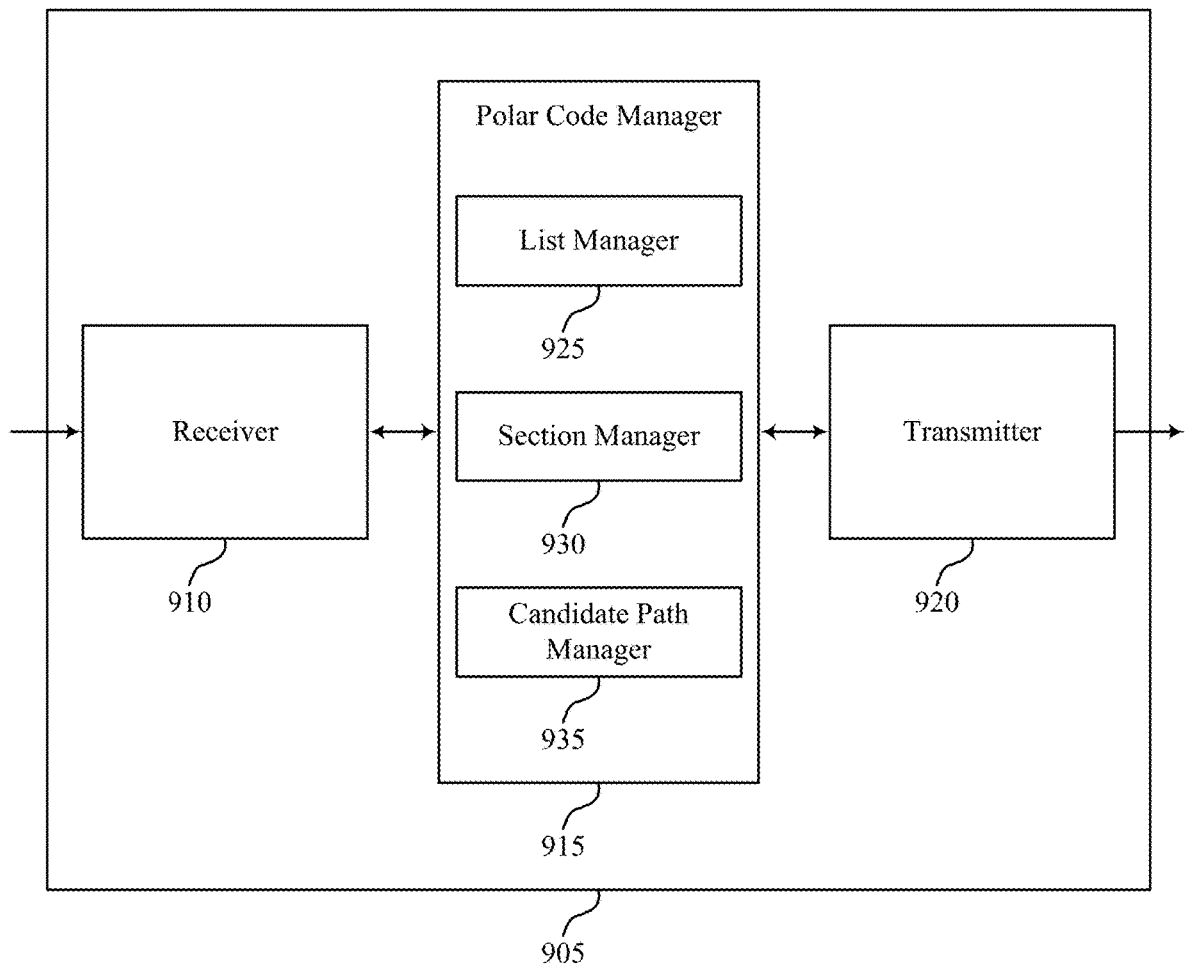

FIG. 9 shows a block diagram 900 of a wireless device 905 that supports list management for parallel operations of polar codes in accordance with aspects of the present disclosure. Wireless device 905 may be an example of aspects of a wireless device 805 or a UE 115 or base station 105 as described with reference to FIGS. 1 and 8. Wireless device 905 may include receiver 910, polar code manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to list management for parallel operations of polar codes, etc.). Information may be passed on to other components of the device. The receiver 910 may be an example of aspects of the transceiver 1135 described with reference to FIG. 11. The receiver 910 may utilize a single antenna or a set of antennas.

Polar code manager 915 may be an example of aspects of the polar code manager 815 or polar code manager 1115 described with reference to FIG. 8 or 11, respectively. Polar code manager 915 may also include list manager 925, section manager 930, and candidate path manager 935.

Section manager 930 may partition an array of candidate path elements into a set of list sections, the array of candidate path elements including a first dimension associated with a list size for decoding of the received codeword and a second dimension associated with a length of the set of bit-channels. In some cases, the first dimension includes rows of the array of candidate path elements and the second dimension includes columns of the array of candidate path elements.

List manager 925 may determine bit-channel metrics for a set of bit-channels of the polar code based on the received codeword, reorganize the array of candidate path elements based on the sectional permutation patterns such that each of the set of candidate paths includes a vector of the array of candidate path elements aligned in the first dimension. In some cases, the reorganizing the array of candidate path elements based on the sectional permutation patterns includes: reorganizing, based on a respective sectional permutation pattern of a given list section, the candidate path elements associated with each list section having a lower list section index than the given list section. In some cases, the determining of at least one bit-channel metric for at least one of the set of bit-channels of the polar code is performed after at least one operation of the list traversal.

Candidate path manager 935 may perform a list traversal over the set of bit-channels based on path metrics derived from the bit-channel metrics to obtain a set of candidate paths, the list traversal including determining a sectional permutation pattern for each list section, the sectional permutation pattern identifying a nested permutation of the candidate path elements over the each list section based on selecting the list size of candidate paths according to path metrics for each bit-channel of the each list section and output at least one of the set of candidate paths. In some cases, the performing the list traversal includes: reorganizing, for each bit-channel of a given list section, the candidate path elements within the given list section having a lower bit-channel index based on the selecting of the candidate paths for the each bit-channel.

Transmitter 920 may transmit signals generated by other components of the device. In some examples, the transmitter 920 may be collocated with a receiver 910 in a transceiver module. For example, the transmitter 920 may be an example of aspects of the transceiver 1135 described with reference to FIG. 11. The transmitter 920 may utilize a single antenna or a set of antennas.

Figure 10:
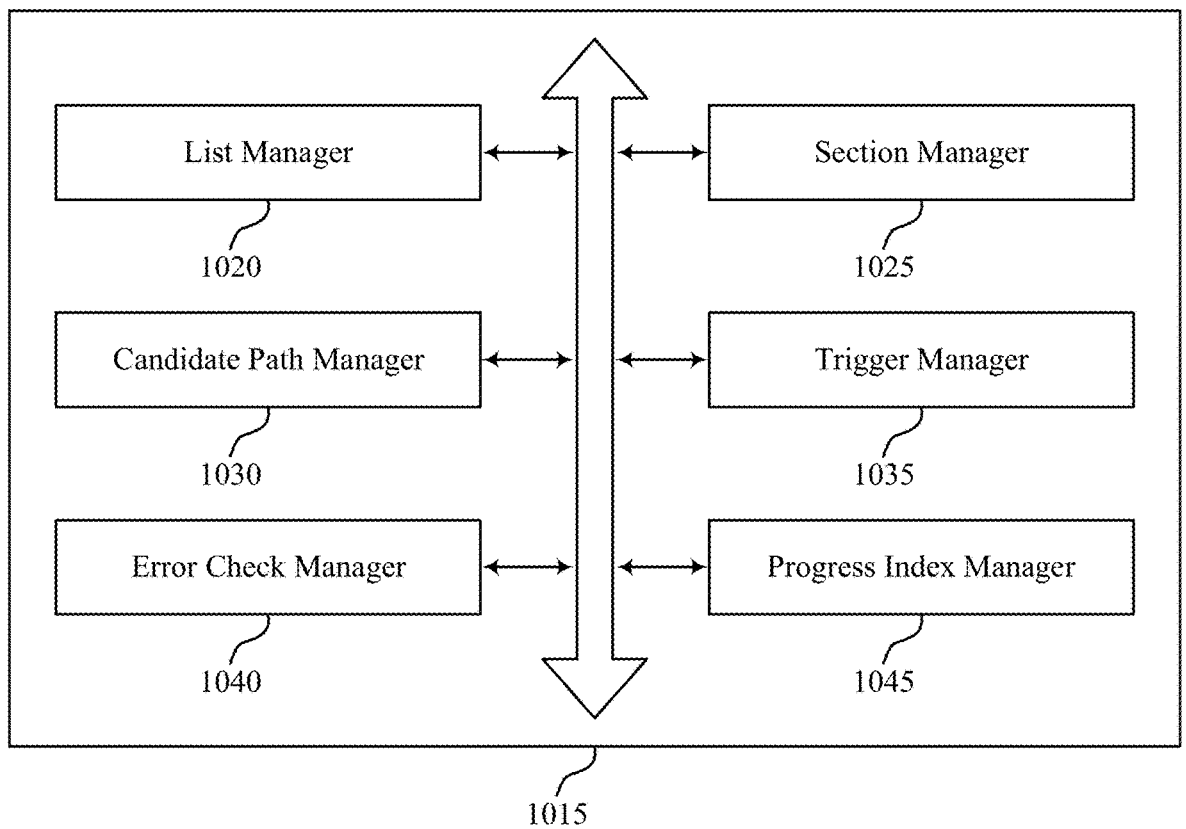

FIG. 10 shows a block diagram 1000 of a polar code manager 1015 that supports list management for parallel operations of polar codes in accordance with aspects of the present disclosure. The polar code manager 1015 may be an example of aspects of a polar code manager 815, a polar code manager 915, or a polar code manager 1115 described with reference to FIGS. 8, 9, and 11. The polar code manager 1015 may include list manager 1020, section manager 1025, candidate path manager 1030, trigger manager 1035, error check manager 1040, and progress index manager 1045. Each of these modules may communicate, directly or indirectly, with one another (e.g., via one or more buses).

Section manager 1025 may partition an array of candidate path elements into a set of list sections, the array of candidate path elements including a first dimension associated with a list size for decoding of the received codeword and a second dimension associated with a length of the set of bit-channels. In some cases, the first dimension includes rows of the array of candidate path elements and the second dimension includes columns of the array of candidate path elements.

List manager 1020 may determine bit-channel metrics for a set of bit-channels of the polar code based on the received codeword, reorganize the array of candidate path elements based on the sectional permutation patterns such that each of the set of candidate paths includes a vector of the array of candidate path elements aligned in the first dimension. In some cases, the reorganizing the array of candidate path elements based on the sectional permutation patterns includes: reorganizing, based on a respective sectional permutation pattern of a given list section, the candidate path elements associated with each list section having a lower list section index than the given list section. In some cases, the determining of at least one bit-channel metric for at least one of the set of bit-channels of the polar code is performed after at least one operation of the list traversal.

Progress index manager 1045 may maintain a progress index that reflects a state of reorganizing the sections based on permutation patterns. For example, where a first section reorganization event occurs prior to completion of the list traversal, the sections up to a given bit-channel index may be reorganized and the progress index may be updated with the given bit-channel or section index. Where a second section reorganization event occurs (e.g., completion of the list traversal), the permutation patterns up to the progress index do not need to be applied again while the permutation patterns of those sections after the progress index may be applied.

Candidate path manager 1030 may perform a list traversal over the set of bit-channels based on path metrics derived from the bit-channel metrics to obtain a set of candidate paths, the list traversal including determining a sectional permutation pattern for each list section, the sectional permutation pattern identifying a nested permutation of the candidate path elements over the each list section based on selecting the list size of candidate paths according to path metrics for each bit-channel of the each list section and output at least one of the set of candidate paths. In some cases, the performing the list traversal includes: reorganizing, for each bit-channel of a given list section, the candidate path elements within the given list section having a lower bit-channel index based on the selecting of the candidate paths for the each bit-channel.

Trigger manager 1035 may identify a section reorganization event, where the reorganizing the array of candidate path elements based on the sectional permutation patterns is based on the identifying the section reorganization event. In some cases, the section reorganization event includes a parity check operation or a termination of the list traversal.

Error check manager 1040 may perform an error check operation on the at least one of the set of candidate paths.

Figure 11:
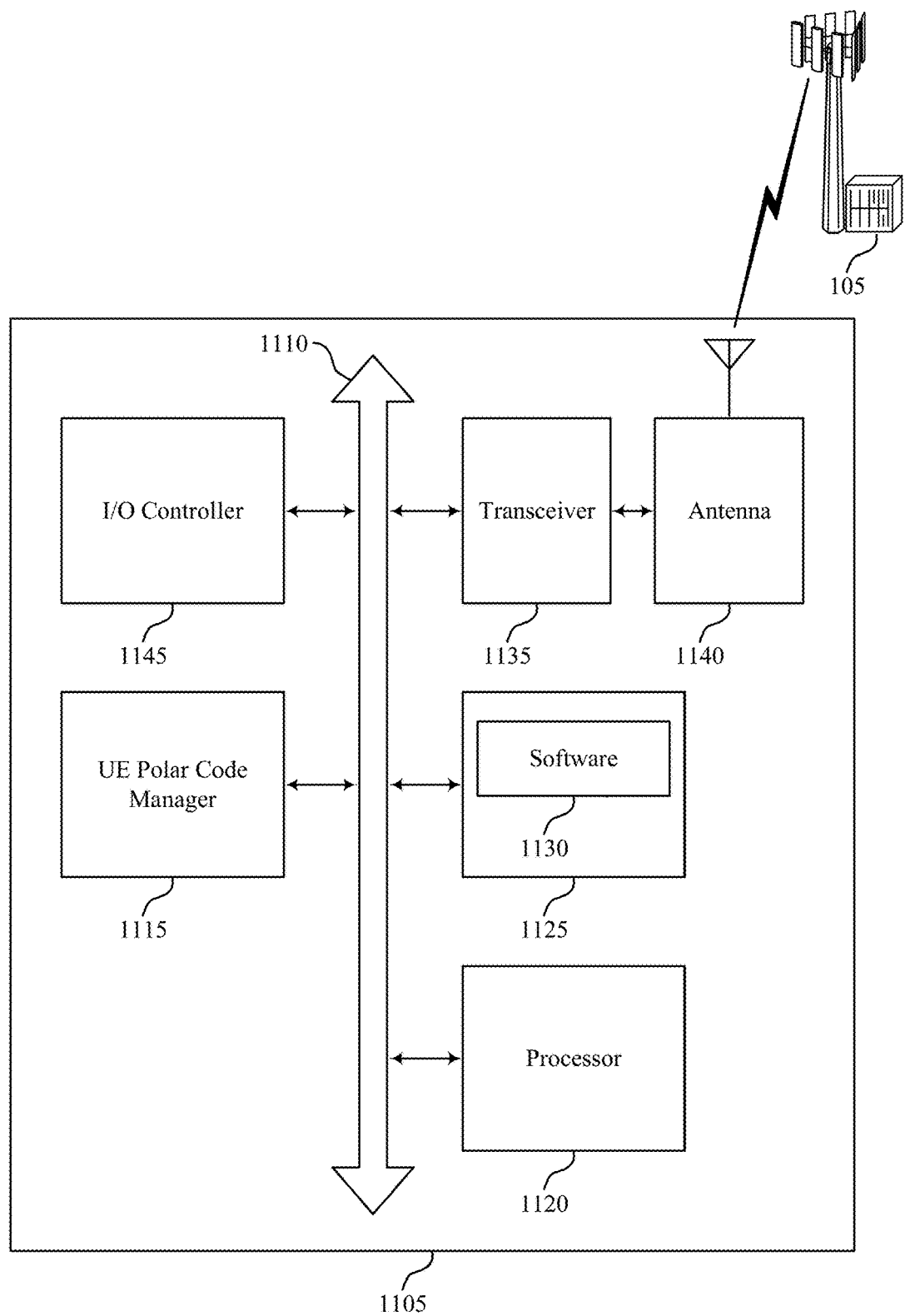
FIG. 11 illustrates a block diagram of a system including a UE that supports list management for parallel operations of polar codes in accordance with aspects of the present disclosure.

FIG. 11 shows a diagram of a system 1100 including a device 1105 that supports list management for parallel operations of polar codes in accordance with aspects of the present disclosure. Device 1105 may be an example of or include the components of wireless device 805, wireless device 905, or a UE 115 as described above, e.g., with reference to FIGS. 1, 8 and 9. Device 1105 may include components for bi-directional voice and data communications including components for transmitting and receiving communications, including UE polar code manager 1115, processor 1120, memory 1125, software 1130, transceiver 1135, antenna 1140, and I/O controller 1145. These components may be in electronic communication via one or more busses (e.g., bus 1110). Device 1105 may communicate wirelessly with one or more base stations 105.

Processor 1120 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1120 may be configured to operate a memory array using a memory controller. In other cases, a memory controller may be integrated into processor 1120. Processor 1120 may be configured to execute computer-readable instructions stored in a memory to perform various functions (e.g., functions or tasks supporting list management for parallel operations of polar codes).

Memory 1125 may include random access memory (RAM) and read only memory (ROM). The memory 1125 may store computer-readable, computer-executable software 1130 including instructions that, when executed, cause the processor to perform various functions described herein. In some cases, the memory 1125 may contain, among other things, a basic input/output system (BIOS) which may control basic hardware and/or software operation such as the interaction with peripheral components or devices.

Software 1130 may include code to implement aspects of the present disclosure, including code to support list management for parallel operations of polar codes. Software 1130 may be stored in a non-transitory computer-readable medium such as system memory or other memory. In some cases, the software 1130 may not be directly executable by the processor but may cause a computer (e.g., when compiled and executed) to perform functions described herein.

Transceiver 1135 may communicate bi-directionally, via one or more antennas, wired, or wireless links as described above. For example, the transceiver 1135 may represent a wireless transceiver and may communicate bi-directionally with another wireless transceiver. The transceiver 1135 may also include a modem to modulate the packets and provide the modulated packets to the antennas for transmission, and to demodulate packets received from the antennas.

In some cases, the wireless device may include a single antenna 1140. However, in some cases the device may have more than one antenna 1140, which may be capable of concurrently transmitting or receiving multiple wireless transmissions.

I/O controller 1145 may manage input and output signals for device 1105. I/O controller 1145 may also manage peripherals not integrated into device 1105. In some cases, I/O controller 1145 may represent a physical connection or port to an external peripheral. In some cases, I/O controller 1145 may utilize an operating system such as iOS®, ANDROID®, MS-DOS®, MS-WINDOWS®, OS/2®, UNIX®, LINUX®, or another known operating system. In other cases, I/O controller 1145 may represent or interact with a modem, a keyboard, a mouse, a touchscreen, or a similar device. In some cases, I/O controller 1145 may be implemented as part of a processor. In some cases, a user may interact with device 1105 via I/O controller 1145 or via hardware components controlled by I/O controller 1145.

Figure 12:
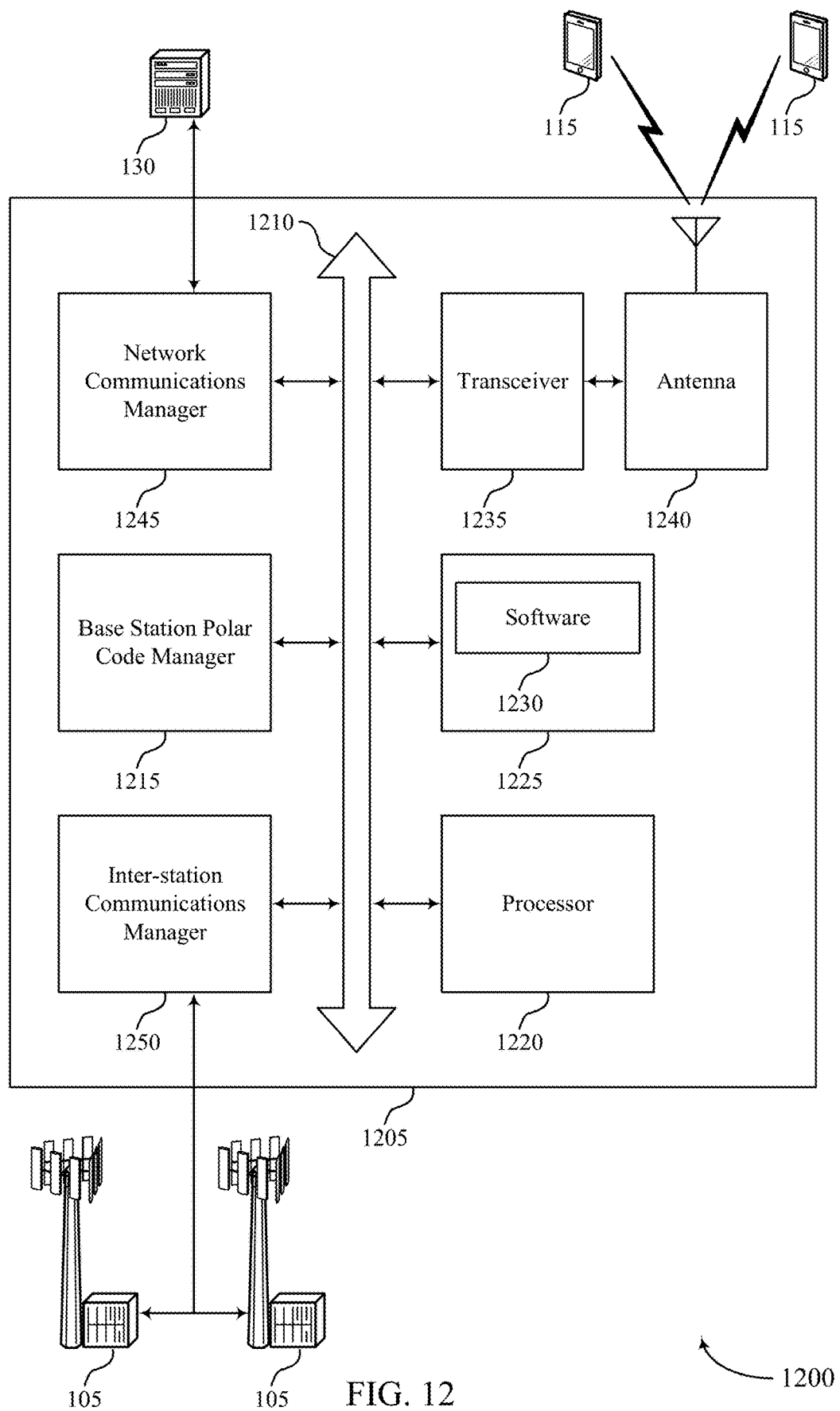
FIG. 12 illustrates a block diagram of a system including a base station that supports list management for parallel operations of polar codes in accordance with aspects of the present disclosure.

FIG. 12 shows a diagram of a system 1200 including a device 1205 that supports list management for parallel operations of polar codes in accordance with aspects of the present disclosure. Device 1205 may be an example of or include the components of wireless device 905, wireless device 1005, or a base station 105 as described above, e.g., with reference to FIGS. 1, 9 and 10. Device 1205 may include components for bi-directional voice and data communications including components for transmitting and receiving communications, including base station polar code manager 1215, processor 1220, memory 1225, software 1230, transceiver 1235, antenna 1240, network communications manager 1245, and inter-station communications manager 1250. These components may be in electronic communication via one or more busses (e.g., bus 1210). Device 1205 may communicate wirelessly with one or more UEs 115.

Processor 1220 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting list management for parallel operations of polar codes).

Memory 1225 may include RAM and ROM. The memory 1225 may store computer-readable, computer-executable software 1230 including instructions that, when executed, cause the processor to perform various functions described herein. In some cases, the memory 1225 may contain, among other things, a BIOS which may control basic hardware and/or software operation such as the interaction with peripheral components or devices.

Software 1230 may include code to implement aspects of the present disclosure, including code to support list management for parallel operations of polar codes. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

Network communications manager 1245 may manage communications with the core network (e.g., via one or more wired backhaul links). For example, the network communications manager 1245 may manage the transfer of data communications for client devices, such as one or more UEs 115.

Inter-station communications manager 1250 may manage communications with other base station 105, and may include a controller or scheduler for controlling communications with UEs 115 in cooperation with other base stations 105. For example, the inter-station communications manager 1250 may coordinate scheduling for transmissions to UEs 115 for various interference mitigation techniques such as beamforming or joint transmission. In some examples, inter-station communications manager 1250 may provide an X2 interface within an Long Term Evolution (LTE)/LTE-A wireless communication network technology to provide communication between base stations 105.

Figure 13:
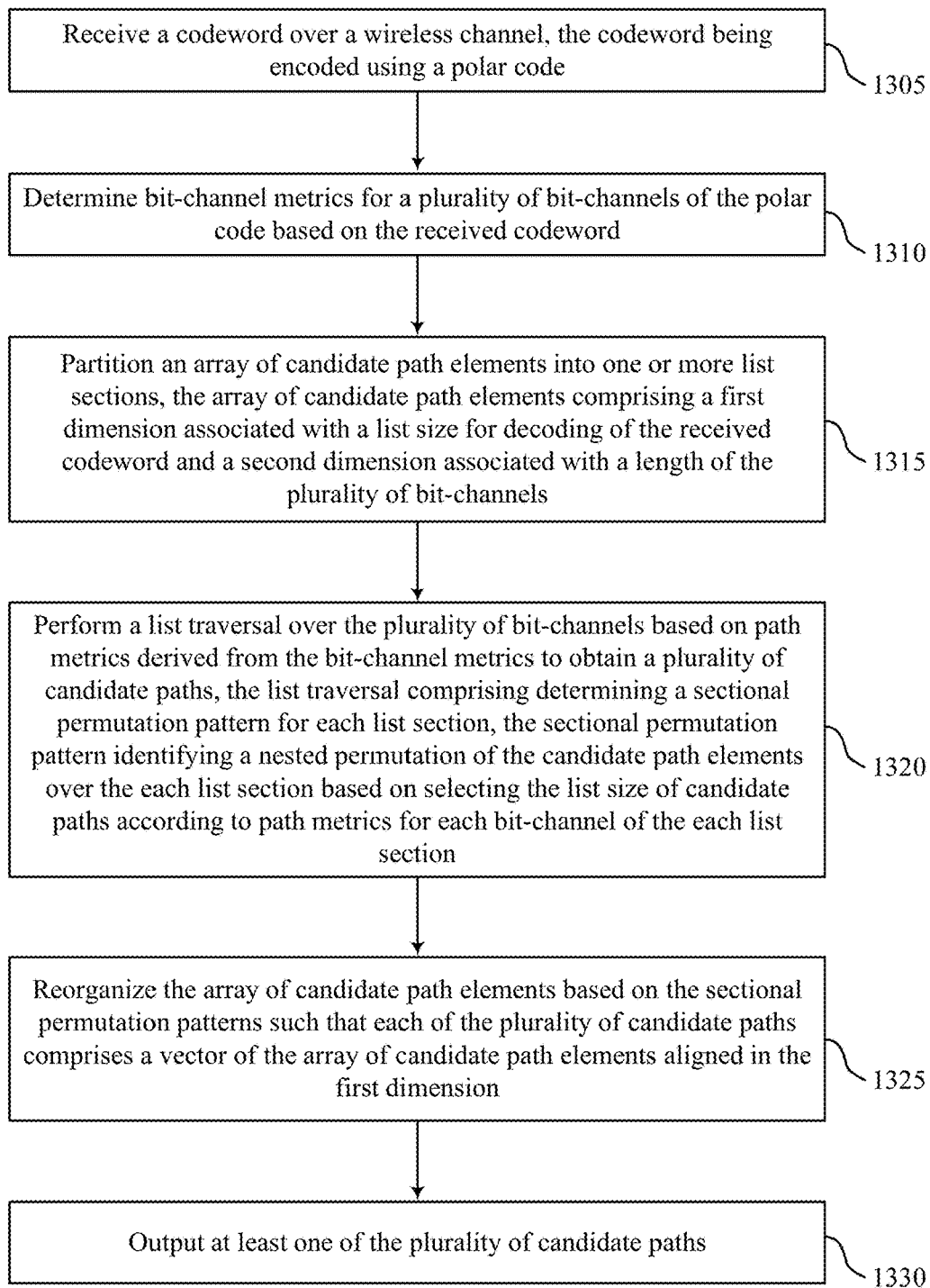
FIGS. 13 through 14 illustrate methods for list management for parallel operations of polar codes in accordance with aspects of the present disclosure.

FIG. 13 shows a flowchart illustrating a method 1300 for list management for parallel operations of polar codes in accordance with aspects of the present disclosure. The operations of method 1300 may be implemented by a receiving entity, such as a UE 115 or base station 105 or its components as described herein. For example, the operations of method 1300 may be performed by a polar code manager as described with reference to FIGS. 8 through 10. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1305 the UE 115 or base station 105 may receive a codeword over a wireless channel, the codeword being encoded using a polar code. The operations of block 1305 may be performed according to the methods described with reference to FIGS. 1 through 7. In certain examples, aspects of the operations of block 1305 may be performed by a receiver as described with reference to FIGS. 8 through 10.

At block 1310 the UE 115 or base station 105 may determine bit-channel metrics for a plurality of bit-channels of the polar code based on the received codeword. The operations of block 1310 may be performed according to the methods described with reference to FIGS. 1 through 7. In certain examples, aspects of the operations of block 1310 may be performed by a list manager as described with reference to FIGS. 8 through 10.

At block 1315 the UE 115 or base station 105 may partition an array of candidate path elements into one or more list sections, the array of candidate path elements comprising a first dimension associated with a list size for decoding of the received codeword and a second dimension associated with a length of the plurality of bit-channels. The operations of block 1315 may be performed according to the methods described with reference to FIGS. 1 through 7. In certain examples, aspects of the operations of block 1315 may be performed by a section manager as described with reference to FIGS. 8 through 10.

At block 1320 the UE 115 or base station 105 may perform a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section. The operations of block 1320 may be performed according to the methods described with reference to FIGS. 1 through 7. In certain examples, aspects of the operations of block 1320 may be performed by a candidate path manager as described with reference to FIGS. 8 through 10.

At block 1325 the UE 115 or base station 105 may reorganize the array of candidate path elements based on the sectional permutation patterns such that each of the plurality of candidate paths comprises a vector of the array of candidate path elements aligned in the first dimension. The operations of block 1325 may be performed according to the methods described with reference to FIGS. 1 through 7. In certain examples, aspects of the operations of block 1325 may be performed by a list manager as described with reference to FIGS. 8 through 10.

At block 1330 the UE 115 or base station 105 may output at least one of the plurality of candidate paths. The operations of block 1330 may be performed according to the methods described with reference to FIGS. 1 through 7. In certain examples, aspects of the operations of block 1330 may be performed by a candidate path manager as described with reference to FIGS. 8 through 10.

Figure 14:
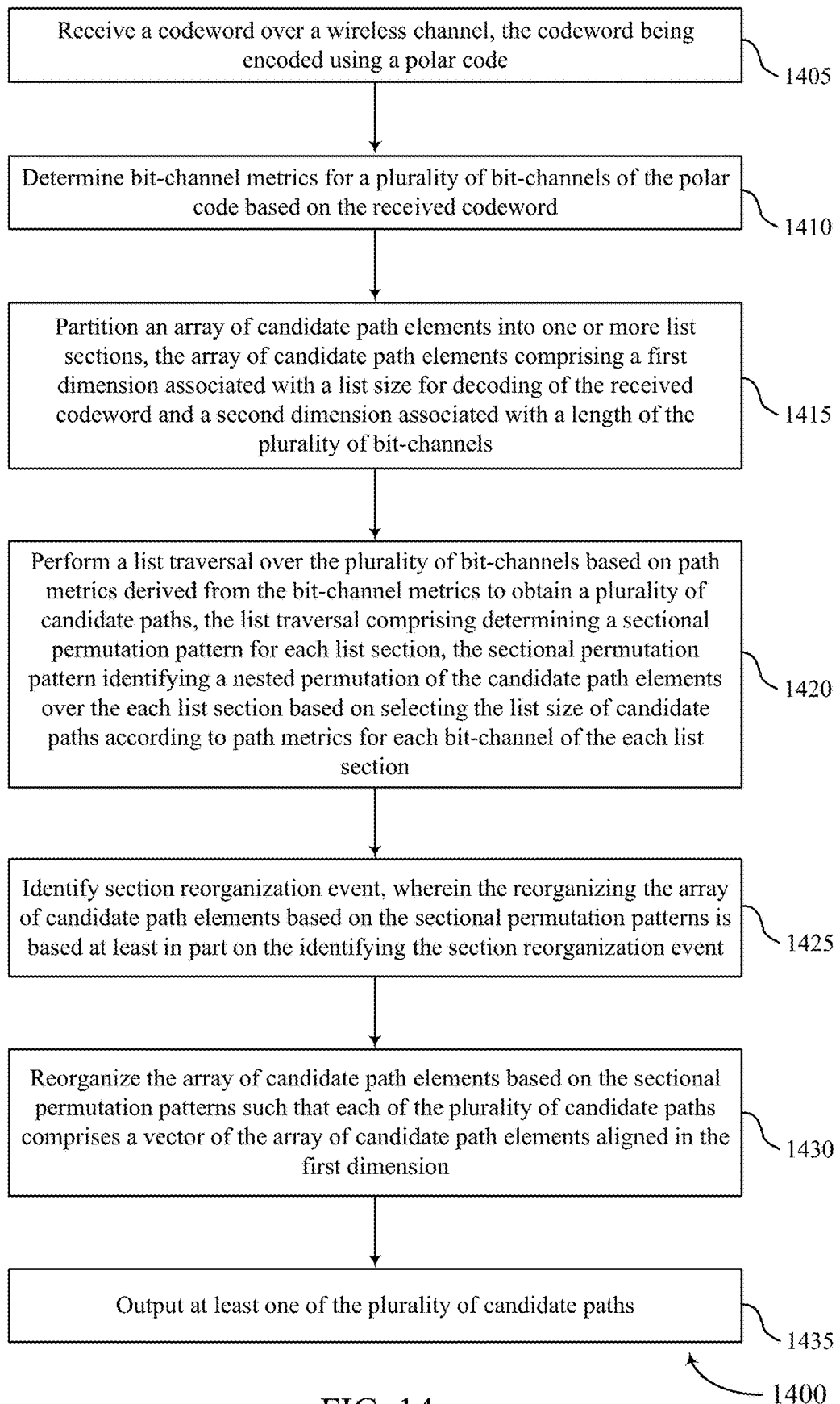

FIG. 14 shows a flowchart illustrating a method 1400 for list management for parallel operations of polar codes in accordance with aspects of the present disclosure. The operations of method 1400 may be implemented by a receiving entity, such as a UE 115 or base station 105 or its components as described herein. For example, the operations of method 1400 may be performed by a polar code manager as described with reference to FIGS. 8 through 10. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the UE 115 or base station 105 may receive a codeword over a wireless channel, the codeword being encoded using a polar code. The operations of block 1405 may be performed according to the methods described with reference to FIGS. 1 through 7. In certain examples, aspects of the operations of block 1405 may be performed by a receiver as described with reference to FIGS. 8 through 10.

At block 1410 the UE 115 or base station 105 may determine bit-channel metrics for a plurality of bit-channels of the polar code based on the received codeword. The operations of block 1410 may be performed according to the methods described with reference to FIGS. 1 through 7. In certain examples, aspects of the operations of block 1410 may be performed by a list manager as described with reference to FIGS. 8 through 10.

At block 1415 the UE 115 or base station 105 may partition an array of candidate path elements into one or more list sections, the array of candidate path elements comprising a first dimension associated with a list size for decoding of the received codeword and a second dimension associated with a length of the plurality of bit-channels. The operations of block 1415 may be performed according to the methods described with reference to FIGS. 1 through 7. In certain examples, aspects of the operations of block 1415 may be performed by a section manager as described with reference to FIGS. 8 through 10.

At block 1420 the UE 115 or base station 105 may perform a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section. The operations of block 1420 may be performed according to the methods described with reference to FIGS. 1 through 7. In certain examples, aspects of the operations of block 1420 may be performed by a candidate path manager as described with reference to FIGS. 8 through 10.

At block 1425 the UE 115 or base station 105 may identify section reorganization event, wherein the reorganizing the array of candidate path elements based on the sectional permutation patterns is based at least in part on the identifying the section reorganization event. The operations of block 1425 may be performed according to the methods described with reference to FIGS. 1 through 7. In certain examples, aspects of the operations of block 1425 may be performed by a trigger manager as described with reference to FIGS. 8 through 10.

At block 1430 the UE 115 or base station 105 may reorganize the array of candidate path elements based on the sectional permutation patterns such that each of the plurality of candidate paths comprises a vector of the array of candidate path elements aligned in the first dimension. The operations of block 1430 may be performed according to the methods described with reference to FIGS. 1 through 7. In certain examples, aspects of the operations of block 1430 may be performed by a list manager as described with reference to FIGS. 8 through 10.

At block 1435 the UE 115 or base station 105 may output at least one of the plurality of candidate paths. The operations of block 1435 may be performed according to the methods described with reference to FIGS. 1 through 7. In certain examples, aspects of the operations of block 1435 may be performed by a candidate path manager as described with reference to FIGS. 8 through 10.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving a codeword over a wireless channel, the codeword being encoded using a polar code;
   determining bit-channel metrics for a plurality of bit-channels of the polar code based on the codeword;
   partitioning an array of candidate path elements into one or more list sections, the array of candidate path elements comprising a first dimension associated with a list size for decoding of the received codeword and a second dimension associated with a length of the plurality of bit-channels;
   performing a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section;
   reorganizing the array of candidate path elements based on the sectional permutation patterns such that each of the plurality of candidate paths comprises a vector of the array of candidate path elements aligned in the first dimension; and
   outputting at least one of the plurality of candidate paths.

2. The method of claim 1, wherein the reorganizing the array of candidate path elements comprises:
   identifying a section reorganization event that occurs prior to completion of the performing of the list traversal over the plurality of bit-channels; and
   reorganizing a first subset of the array of candidate path elements based on a first subset of the sectional permutation patterns.

3. The method of claim 2, further comprising:
   updating a progress index reflecting reorganization of the first subset of the array of candidate path elements;
   identifying a second section reorganization event; and
   reorganizing a second subset of the array of candidate path elements based on a second subset of the sectional permutation patterns after the progress index.

4. The method of claim 2, wherein:
   the section reorganization event comprises a parity check operation or a bit traversal threshold.

5. The method of claim 1, wherein:
   the reorganizing the array of candidate path elements based on the sectional permutation patterns comprises:

reorganizing, based at least in part on a respective sectional permutation pattern of a given list section, the candidate path elements associated with each list section having a lower list section index than the given list section.

6. The method of claim 1, wherein:
the performing the list traversal comprises: reorganizing, for each bit-channel of a given list section, the candidate path elements within the given list section having a lower bit-channel index based on the selecting of the candidate paths for the each bit-channel.

7. The method of claim 1, further comprising:
performing an error check operation on the at least one of the plurality of candidate paths.

8. The method of claim 1, wherein:
the first dimension comprises rows of the array of candidate path elements and the second dimension comprises columns of the array of candidate path elements.

9. The method of claim 1, wherein:
the determining of at least one bit-channel metric for at least one of the plurality of bit-channels of the polar code is performed after at least one operation of the list traversal.

10. An apparatus for wireless communication, comprising:
means for receiving a codeword over a wireless channel, the codeword being encoded using a polar code;
means for determining bit-channel metrics for a plurality of bit-channels of the polar code based on the codeword;
means for partitioning an array of candidate path elements into one or more list sections, the array of candidate path elements comprising a first dimension associated with a list size for decoding of the received codeword and a second dimension associated with a length of the plurality of bit-channels;
means for performing a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section;
means for reorganizing the array of candidate path elements based on the sectional permutation patterns such that each of the plurality of candidate paths comprises a vector of the array of candidate path elements aligned in the first dimension; and
means for outputting at least one of the plurality of candidate paths.

11. The apparatus of claim 10, wherein the means for reorganizing the array of candidate path elements:
identifies a section reorganization event that occurs prior to completion of the performing of the list traversal over the plurality of bit-channels; and
reorganizes a first subset of the array of candidate path elements based on a first subset of the sectional permutation patterns.

12. The apparatus of claim 11, wherein the means for reorganizing the array of candidate path elements:
updates a progress index reflecting reorganization of the first subset of the array of candidate path elements;
identifies a second section reorganization event; and
reorganizes a second subset of the array of candidate path elements based on a second subset of the sectional permutation patterns after the progress index.

13. The apparatus of claim 11, wherein:
the section reorganization event comprises a parity check operation or a bit traversal threshold.

14. The apparatus of claim 10, wherein:
the reorganizing the array of candidate path elements based on the sectional permutation patterns comprises: reorganizing, based at least in part on a respective sectional permutation pattern of a given list section, the candidate path elements associated with each list section having a lower list section index than the given list section.

15. The apparatus of claim 10, wherein:
the performing the list traversal comprises: reorganizing, for each bit-channel of a given list section, the candidate path elements within the given list section having a lower bit-channel index based on the selecting of the candidate paths for the each bit-channel.

16. The apparatus of claim 10, further comprising:
means for performing an error check operation on the at least one of the plurality of candidate paths.

17. The apparatus of claim 10, wherein:
the first dimension comprises rows of the array of candidate path elements and the second dimension comprises columns of the array of candidate path elements.

18. The apparatus of claim 10, wherein:
the determining of at least one bit-channel metric for at least one of the plurality of bit-channels of the polar code is performed after at least one operation of the list traversal.

19. An apparatus for wireless communication, in a system comprising:
a processor;
memory in electronic communication with the processor; and
instructions stored in the memory and operable, when executed by the processor, to cause the apparatus to:
receive a codeword over a wireless channel, the codeword being encoded using a polar code;
determine bit-channel metrics for a plurality of bit-channels of the polar code based on the codeword;
partition an array of candidate path elements into one or more list sections, the array of candidate path elements comprising a first dimension associated with a list size for decoding of the received codeword and a second dimension associated with a length of the plurality of bit-channels;
perform a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section;
reorganize the array of candidate path elements based on the sectional permutation patterns such that each of the plurality of candidate paths comprises a vector of the array of candidate path elements aligned in the first dimension; and
output at least one of the plurality of candidate paths.

20. The apparatus of claim 19, wherein the instructions are further executable by the processor to:

identify a section reorganization event that occurs prior to completion of the performing of the list traversal over the plurality of bit-channels; and reorganize a first subset of the array of candidate path elements based on a first subset of the sectional permutation patterns.

21. The apparatus of claim 20, wherein the instructions are further executable by the processor to:

update a progress index reflecting reorganization of the first subset of the array of candidate path elements;

identify a second section reorganization event; and reorganize a second subset of the array of candidate path elements based on a second subset of the sectional permutation patterns after the progress index.

22. The apparatus of claim 20, wherein:

the section reorganization event comprises a parity check operation or a bit traversal threshold.

23. The apparatus of claim 19, wherein:

the reorganizing the array of candidate path elements based on the sectional permutation patterns comprises: reorganizing, based at least in part on a respective sectional permutation pattern of a given list section, the candidate path elements associated with each list section having a lower list section index than the given list section.

24. The apparatus of claim 19, wherein:

the performing the list traversal comprises: reorganizing, for each bit-channel of a given list section, the candidate path elements within the given list section having a lower bit-channel index based on the selecting of the candidate paths for the each bit-channel.

25. The apparatus of claim 19, wherein the instructions are further executable by the processor to:

perform an error check operation on the at least one of the plurality of candidate paths.

26. The apparatus of claim 19, wherein:

the first dimension comprises rows of the array of candidate path elements and the second dimension comprises columns of the array of candidate path elements.

27. The apparatus of claim 19, wherein:

the determining of at least one bit-channel metric for at least one of the plurality of bit-channels of the polar code is performed after at least one operation of the list traversal.

28. A non-transitory computer readable medium storing code for wireless communication, the code comprising instructions executable by a processor to:

receive a codeword over a wireless channel, the codeword being encoded using a polar code;

determine bit-channel metrics for a plurality of bit-channels of the polar code based on the codeword;

partition an array of candidate path elements into one or more list sections, the array of candidate path elements comprising a first dimension associated with a list size for decoding of the received codeword and a second dimension associated with a length of the plurality of bit-channels;

perform a list traversal over the plurality of bit-channels based on path metrics derived from the bit-channel metrics to obtain a plurality of candidate paths, the list traversal comprising determining a sectional permutation pattern for each list section, the sectional permutation pattern identifying a nested permutation of the candidate path elements over the each list section based on selecting the list size of candidate paths according to path metrics for each bit-channel of the each list section;

reorganize the array of candidate path elements based on the sectional permutation patterns such that each of the plurality of candidate paths comprises a vector of the array of candidate path elements aligned in the first dimension; and output at least one of the plurality of candidate paths.

29. The non-transitory computer-readable medium of claim 28, wherein the instructions are further executable by the processor to:

identify a section reorganization event that occurs prior to completion of the performing of the list traversal over the plurality of bit-channels; and reorganize a first subset of the array of candidate path elements based on a first subset of the sectional permutation patterns.

30. The non-transitory computer-readable medium of claim 29, wherein the instructions are further executable by the processor to:

update a progress index reflecting reorganization of the first subset of the array of candidate path elements;

identify a second section reorganization event; and reorganize a second subset of the array of candidate path elements based on a second subset of the sectional permutation patterns after the progress index.

* * * * *